(12) United States Patent
Yamazaki et al.

(10) Patent No.: US 8,269,227 B2
(45) Date of Patent: Sep. 18, 2012

(54) LIGHT EMITTING DEVICE AND ELECTRONIC DEVICE

(75) Inventors: Shunpei Yamazaki, Tokyo (JP); Tomoe Matsubara, Tokyo (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 20 days.

(21) Appl. No.: 11/446,787

(22) Filed: Jun. 5, 2006

(65) Prior Publication Data

US 2006/0284204 A1  Dec. 21, 2006

(30) Foreign Application Priority Data

Jun. 9, 2005  (JP) ................ 2005-169061

(51) Int. Cl.
  *H01L 29/18* (2006.01)
  *H01L 33/00* (2010.01)
(52) U.S. Cl. ........... 257/88; 257/89; 257/79; 257/83; 257/100; 313/506
(58) Field of Classification Search .......... 257/98, 257/79, 83, 88, 89, 100; 313/501–512, 499
  See application file for complete search history.

(56) References Cited

U.S. PATENT DOCUMENTS

| | | | |
|---|---|---|---|
| 5,294,870 A | 3/1994 | Tang et al. | |
| 5,989,737 A | 11/1999 | Xie et al. | |
| 6,140,764 A | 10/2000 | Xu et al. | 313/504 |
| 6,423,429 B2 | 7/2002 | Kido et al. | |
| 6,465,115 B2 | 10/2002 | Shi et al. | |
| 6,486,601 B1 | 11/2002 | Sakai et al. | |
| 6,505,901 B1 | 1/2003 | Fukuda | |
| 6,589,673 B1 | 7/2003 | Kido et al. | |
| 6,903,506 B2 | 6/2005 | Kita et al. | 313/506 |
| 6,956,323 B2 * | 10/2005 | Kawaguchi et al. | 313/501 |
| 7,173,373 B2 * | 2/2007 | Yamada et al. | 313/505 |
| 7,223,641 B2 * | 5/2007 | Maekawa | 438/149 |
| 7,531,958 B2 | 5/2009 | Nishikawa et al. | |
| 7,541,734 B2 | 6/2009 | Yamazaki et al. | |
| 7,615,921 B2 | 11/2009 | Kimura | |
| 7,839,084 B2 | 11/2010 | Nishikawa et al. | |
| 2003/0189401 A1 | 10/2003 | Kido et al. | |
| 2004/0004434 A1 * | 1/2004 | Nishi et al. | 313/506 |
| 2004/0135502 A1 * | 7/2004 | Kobayashi et al. | 313/506 |
| 2005/0040762 A1 * | 2/2005 | Kurihara | 313/512 |
| 2005/0073247 A1 * | 4/2005 | Yamazaki et al. | 313/503 |
| 2005/0077816 A1 * | 4/2005 | Yamada et al. | 313/503 |
| 2005/0084712 A1 | 4/2005 | Kido et al. | |

(Continued)

FOREIGN PATENT DOCUMENTS

EP  0 550 063 A2  7/1993

(Continued)

*Primary Examiner* — Telly Green
(74) *Attorney, Agent, or Firm* — Husch Blackwell LLP

(57) ABSTRACT

The invention provides a light emitting device which uses a color conversion layer, with high light emission efficiency and a low driving voltage. The light emitting device includes a light emitting element having a pair of electrodes and a layer containing an organic compound sandwiched between the pair of electrodes, and a color conversion layer which absorbs light emitted from the light emitting element and emits light with a longer wavelength than a wavelength of the absorbed light. A portion of the layer containing an organic compound includes a buffer layer containing a composite material including an organic compound having a hole transporting property and a metal compound. The thickness of the buffer layer is determined so that the light emission efficiency becomes high.

27 Claims, 20 Drawing Sheets

U.S. PATENT DOCUMENTS

| | | |
|---|---|---|
| 2005/0084713 A1 | 4/2005 | Kido et al. |
| 2005/0098207 A1 | 5/2005 | Matsumoto et al. |
| 2005/0106419 A1 | 5/2005 | Endoh et al. |
| 2005/0127820 A1* | 6/2005 | Yamazaki et al. ............ 313/501 |
| 2005/0170208 A1 | 8/2005 | Yatsunami et al. |
| 2005/0248267 A1 | 11/2005 | Gyoutoku et al. |
| 2006/0008740 A1 | 1/2006 | Kido et al. |
| 2006/0183625 A1* | 8/2006 | Miyahara .................... 501/98.4 |
| 2006/0192485 A1* | 8/2006 | Song et al. .................. 313/506 |
| 2007/0001570 A1 | 1/2007 | Nomura et al. |
| 2007/0075627 A1 | 4/2007 | Kimura et al. |
| 2007/0182317 A1 | 8/2007 | Kido et al. |
| 2007/0200125 A1 | 8/2007 | Ikeda et al. |
| 2008/0024402 A1* | 1/2008 | Nishikawa et al. ............ 345/82 |
| 2009/0206726 A1 | 8/2009 | Yamazaki et al. |

FOREIGN PATENT DOCUMENTS

| | | |
|---|---|---|
| EP | 1 009 044 A2 | 6/2000 |
| EP | 1 030 382 A2 | 8/2000 |
| EP | 1 089 361 A2 | 4/2001 |
| EP | 1 351 558 A1 | 10/2003 |
| EP | 1 524 706 A2 | 4/2005 |
| EP | 2 270 897 A2 | 1/2011 |
| JP | 3-274695 | 12/1991 |
| JP | 5-258860 | 10/1993 |
| JP | 9-63771 | 3/1997 |
| JP | 9-245511 | 9/1997 |
| JP | 11-307259 | 11/1999 |
| JP | 11-307264 | 11/1999 |
| JP | 2000-182776 | 6/2000 |
| JP | 2000-243573 | 9/2000 |
| JP | 2000-315580 | 11/2000 |
| JP | 2001-244079 | 9/2001 |
| JP | 2002-52801 | 7/2002 |
| JP | 2002-359076 | 12/2002 |
| JP | 2003-272855 | 9/2003 |
| JP | 2003-272860 | 9/2003 |
| JP | 2004-158469 | 6/2004 |
| JP | 2005-26121 | 1/2005 |
| JP | 2005-32618 | 2/2005 |
| JP | 2005-50597 | 2/2005 |
| JP | 2005-123095 | 5/2005 |
| JP | 2005-129510 | 5/2005 |
| JP | 2005-129519 | 5/2005 |
| WO | WO 00/04594 A1 | 1/2000 |
| WO | WO 2005/031798 | 4/2005 |

* cited by examiner

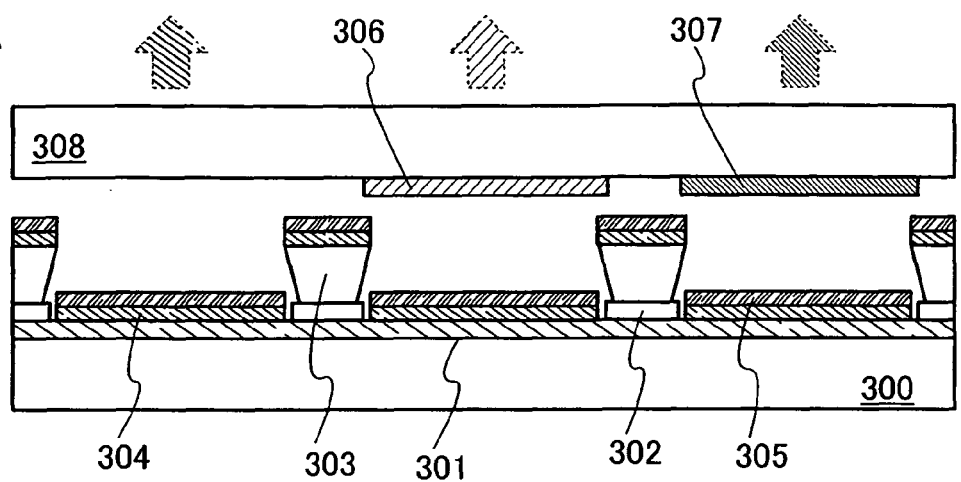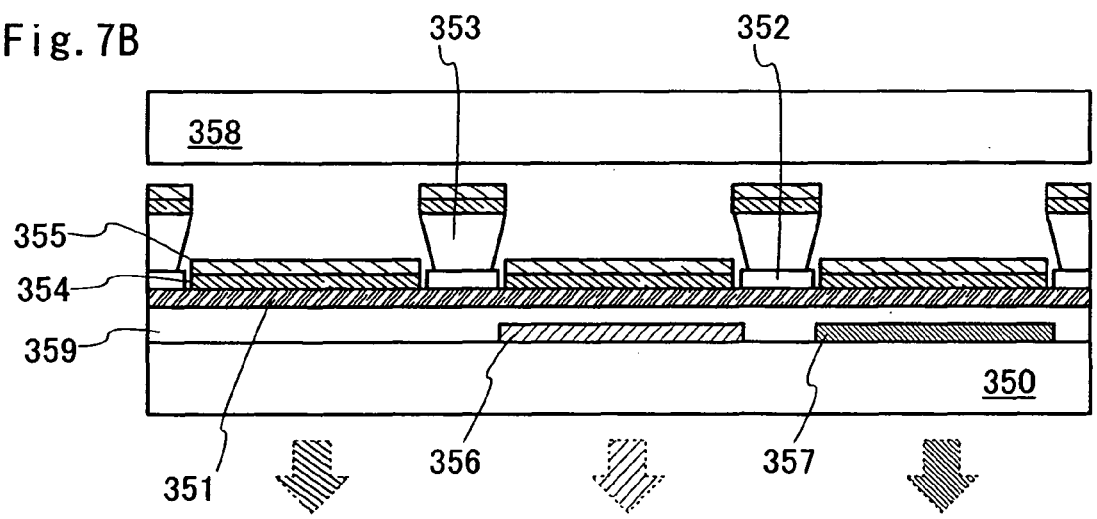

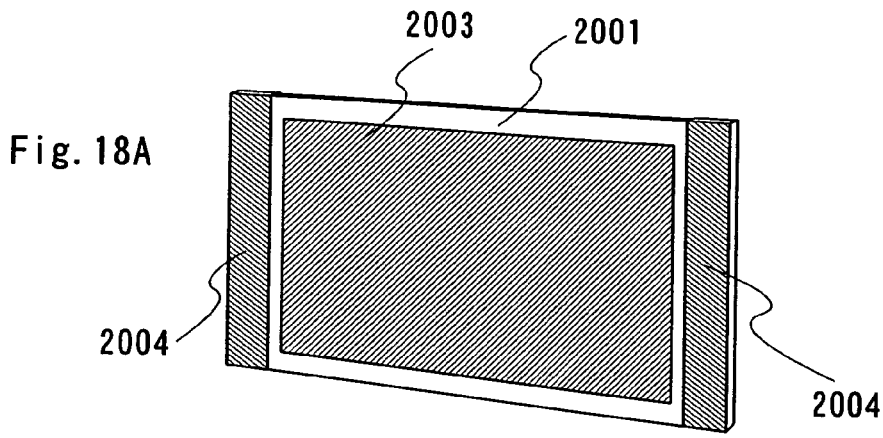
Fig. 18A
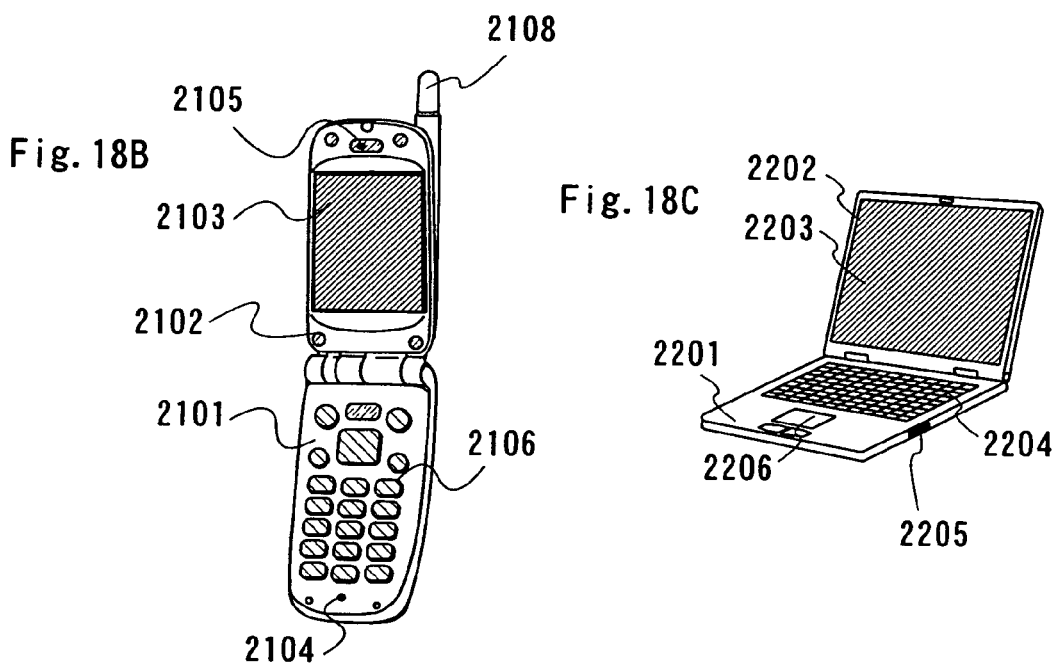
Fig. 18B
Fig. 18C
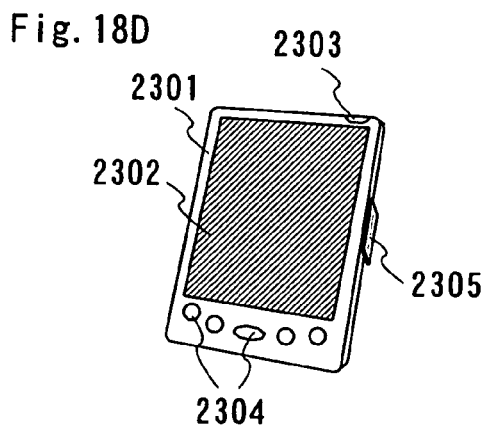
Fig. 18D
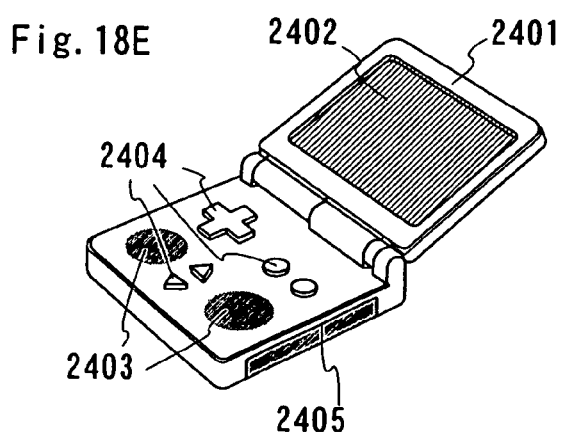
Fig. 18E

LIGHT EMITTING DEVICE AND ELECTRONIC DEVICE

BACKGROUND OF THE INVENTION

1. Field of the Invention

The present invention relates to a light emitting device using a light emitting element which emits light when a current is supplied. In particular, the invention relates to a light emitting device which has a light emitting element having a layer containing an organic material and which realizes full color display by using a color conversion layer.

2. Description of the Related Art

Development has been made on a light emitting device which has a layer containing an organic material sandwiched between a pair of electrodes and has a light emitting element which emits light when a current is supplied between the electrodes. Such a light emitting device is advantageous in realizing thinness and lightweight as compared to other display devices which are called thin display devices. In addition, being self-luminous type, such a light emitting device has favorable visibility and fast response speed. Moreover, it is potentially possible to reduce power consumption considerably. Such a light emitting device is actively developed and put into practical use in some markets as a next-generation display.

There are some methods to realize such a light emitting device capable of performing full color display. One method is to deposit materials which exhibit light emission of each red, green, and blue separately by using a mask to manufacture a light emitting element which emits each color, another method is to use color filters of red, green, and blue for a light emitting element which exhibits white light emission to obtain light emission of three colors, and another method is convert mono-color light with a short wavelength into a required color through a color conversion layer. These methods are called a separate deposition method, a color filter (CF) method, and a color conversion method respectively for convenience.

Each of the three methods has advantages and disadvantages. It is a great advantage of the color conversion method to require no separate deposition of light emitting layers since light of only one color is emitted from a light emitting element. Moreover, the color conversion method is considered more efficient since desired light emission is obtained by using absorption of light, excitation, and light emission by a color conversion layer as compared to a CF method in which a part of a light emission spectrum is simply cut.

However, the efficiency of the color conversion method is still low as compared to the separate deposition method in which three colors are directly emitted from respective light emitting elements, and that the color conversion method is researched for further improvement in efficiency (for example, see Patent Documents 1 and 2).

[Patent Document 1]
Japanese Patent-Document Laid-open No. 2002-359076
[Patent Document 2]
Published Japanese Translation of PCT International Publication for Patent Application No. 2002-520801

According to the methods disclosed in these patent documents, a micro resonant structure formed of a dielectric mirror which is formed outside a light emitting element is used to improve the directivity of light and increase the amount of incident light to a color conversion layer (Patent Document 1), or a light emission peak is matched with an absorption peak of a color conversion layer (Patent Document 2) to improve the efficiency.

In the case of providing a micro resonant structure outside a light emitting element as disclosed in Patent Documents 1 and 2, light emitted from the light emitting element is required to pass through an electrode formed of a light-transmissive conductive film to reach the micro resonant structure. As a result, loss of the light decreases the efficiency.

SUMMARY OF THE INVENTION

In view of this, the invention provides a light emitting device with higher efficiency, which uses a color conversion layer.

Moreover, a layer containing an organic material sandwiched between a pair of electrodes of a light emitting element is quite thin, and the element can be driven with a driving voltage in a practical range even by using a material with low conductivity caused by the thinness. However, in the case of manufacturing a resonant structure in a light emitting element, the layer containing an organic material is optically as thick as about a light emission wavelength (450 to 650 nm). When a refractive index is 1.7, the actual thickness becomes about 265 to 380 nm. Therefore, a driving voltage is considerably increased.

In view of this, the invention provides a light emitting device with high efficiency and low driving voltage, which uses a color conversion layer.

One structure of the invention to solve the aforementioned problems is a light emitting device including a pair of electrodes and a layer containing an organic compound sandwiched between the pair of electrodes, a color conversion layer which absorbs light emitted from the light emitting element and emits light with a longer wavelength than a wavelength of the absorbed light, and a buffer layer which includes a composite material containing an organic compound having a hole transporting property and a metal compound in a portion of the organic compound layer.

One structure of the invention to solve the aforementioned problems is a light emitting device including a light emitting element which includes a pair of electrodes and a layer containing an organic compound sandwiched between the pair of electrodes, and a color conversion layer which absorbs light emitted from the light emitting element and emits light with a longer wavelength than a wavelength of the absorbed light. A buffer layer which includes a composite material containing an organic compound having a hole transporting property and a metal compound is included in a portion of the organic compound layer. The thickness of the buffer layer is determined so that light emission efficiency thereof becomes high. The enhancement of the light emission efficiency is preferably verified by comparing the current efficiencies of the light emitting element having a buffer layer and a light emitting element having no buffer layer. When the current efficiency of the light emitting element having the buffer layer is higher, the light emission efficiency can be considered to be enhanced.

One structure of the invention to solve the aforementioned problems is a light emitting device having the aforementioned structure, in which one of the pair of electrodes is formed of a material having high reflectivity and the other is formed of a light-transmissive conductive material.

One structure of the invention to solve the aforementioned problems is a light emitting device including a light emitting element which includes a pair of electrodes and a layer containing an organic compound sandwiched between the pair of electrodes, and a color conversion layer which absorbs light emitted from the light emitting element and emits light with a longer wavelength than a wavelength of the absorbed light.

The layer containing an organic compound includes at least a light emitting layer and a buffer layer which includes a composite material containing an organic compound having a hole transporting property and a metal compound. An optical distance L between a light emitting region of the light emitting layer and an electrode where the buffer layer is formed based on the light emitting layer is controlled by the thickness of the buffer layer.

One structure of the invention to solve the aforementioned problems is a light emitting device having the aforementioned structure, in which the optical distance L between the light emitting region and the electrode satisfies $L=(2m-1)\lambda/4$ when the maximum wavelength of light emitted from the light emitting element is $\lambda$.

One structure of the invention to solve the aforementioned problems is a light emitting device having the aforementioned structure, in which the electrode where the buffer layer is formed based on the light emitting layer is formed of a highly reflective material while the other electrode is formed of a light-transmissive material.

One structure of the invention to solve the aforementioned problems is a light emitting device having the aforementioned structure, in which the metal compound is oxide or nitride of a transition metal.

One structure of the invention to solve the aforementioned problems is a light emitting device having the aforementioned structure, in which the metal compound is oxide or nitride of a metal which belongs to groups 4 to 8 of the periodic table of elements.

One structure of the invention to solve the aforementioned problems is a light emitting device having the aforementioned structure, in which the metal compound is vanadium oxide, tantalum oxide, molybdenum oxide, tungsten oxide, rhenium oxide, or ruthenium oxide.

By the invention, a light emitting device which uses a color conversion layer can operate more efficiently. Moreover, a light emitting device which uses a color conversion layer can operate more efficiently with a lower driving voltage.

BRIEF DESCRIPTION OF DRAWINGS

FIGS. 7A and 7B are cross sectional schematic views of a light emitting device of the invention.

FIGS. 18A to 18E are schematic views of electronic devices of the invention.

DETAILED DESCRIPTION OF THE INVENTION

Although the invention will be fully described by way of embodiment modes and embodiments with reference to the accompanying drawings, it is to be understood that various changes and modifications will be apparent to those skilled in the art. Therefore, unless such changes and modifications depart from the scope of the invention, they should be construed as being included therein.

Embodiment Mode 1

Figure 1A:
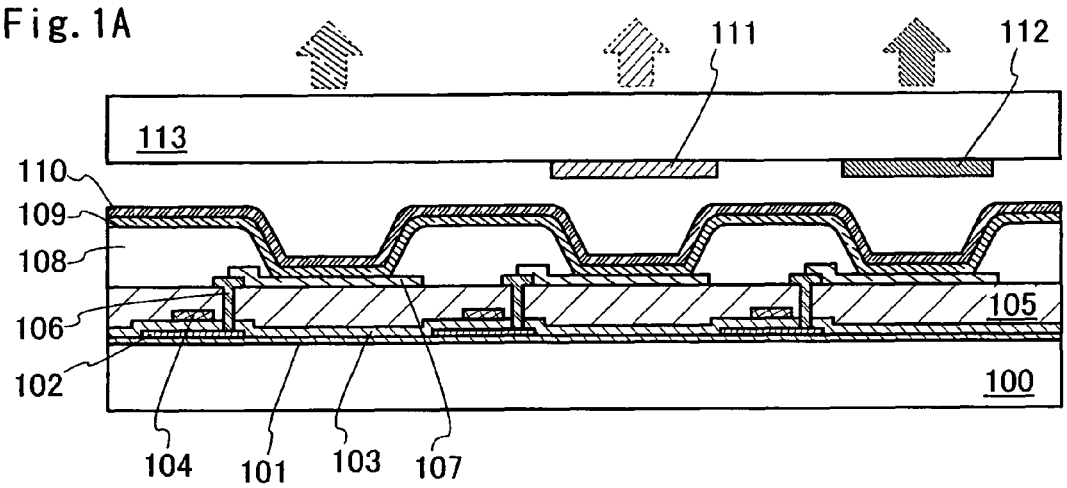
FIGS. 1A and 1B are cross sectional schematic views of a light emitting device of the invention.

FIG. 1A shows an example of a structure of a light emitting device of the invention. FIG. 1A is a portion of a cross sectional view showing a pixel portion of an active matrix light emitting device. The light emitting device of the invention shown in FIG. 1A includes a substrate 100, a base insulating film 101, a semiconductor layer 102, a gate insulating film 103, a gate electrode 104, an interlayer insulating film 105, a connecting portion 106, a first electrode 107 of a light emitting element, a partition 108, a layer 109 containing an organic compound, a second electrode 110 of the light emitting element, a color conversion layer (green) 111, a color conversion layer (red) 112, and a counter substrate 113. It is to be noted that a sealing material is omitted in FIGS. 1A and 1B.

The light emitting element is formed in a portion where the layer 109 containing an organic compound is sandwiched between the first electrode 107 and the second electrode 110 of the light emitting element. The light emitting element is connected to a thin film transistor formed of the semiconductor layer 102, the gate insulating film 103, and the gate electrode 104 through the connecting portion 106 which is electrically in contact with the first electrode 107, thereby its light emission is controlled. Moreover, in this embodiment mode, the first electrode 107 functions as a reflective electrode formed of a highly reflective material and the second electrode 110 functions as a light-transmissive electrode formed of a light-transmissive conductive material. Light is emitted in a direction of the second direction 110.

In this embodiment mode, light emitted from the light emitting element is light of a near-ultraviolet region to a blue-green region. The light emission from the light emitting element passes through the color conversion layer (green) 111 and the color conversion layer (red) 112 to obtain red and green light while it does not pass through a color conversion layer but is emitted outside the light emitting device to obtain blue light. In this manner, light of three colors: red, green, and blue can be obtained. A color conversion layer is a layer which absorbs light of a certain waveband and emits light of a waveband with a longer wavelength than that of the absorbed light.

Figure 2A:
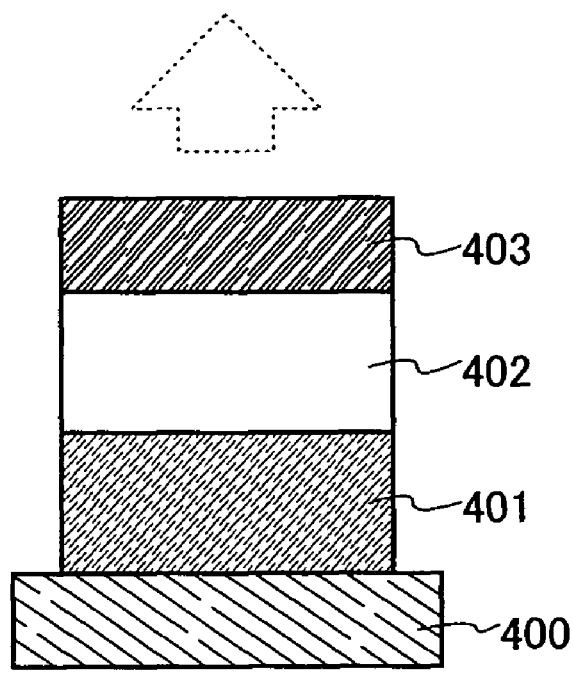
FIGS. 2A and 2B are cross sectional schematic views of light emitting elements.

The layer 109 containing an organic compound has a stacked-layer structure as shown in FIG. 2A. It is to be noted that a first electrode 400 shown in FIG. 2A corresponds to the first electrode 107 in FIG. 1A and a second electrode 403 in FIG. 2A corresponds to the second electrode 110 in FIG. 1A. Further, a stack of a buffer layer 401 and a light emitting layer 402 corresponds to the layer 109 containing an organic compound in FIG. 1A. That is, the layer 109 containing an organic compound is formed of a stack of the buffer layer 401 and the light emitting layer 402. Moreover, the buffer layer is provided on the first electrode 107 side which is a reflective electrode.

First, description is made of the light emitting layer 402. The light emitting layer 402 is formed of a single layer or stacked-layer structure including a layer containing at least a light emitting substance. FIGS. 3A to 3D show specific stacked-layer structures of the light emitting layer 402. In FIGS. 3A to 3D, reference numeral 410 denotes a hole injecting layer formed of a material having a hole injecting property, 411 denotes a hole transporting layer formed of a material having a hole transporting property, 412 denotes an electron transporting layer formed of a material having an electron transporting property, and 413 denotes an electron injecting layer formed of a material having an electron injecting property. Moreover, reference numerals 420, 422, 424, and 426 denote layers each containing a light emitting substance and 421, 423, and 425 denote light emitting regions. It is to be noted that a layer having another function such as a blocking layer for assisting efficient recombination of electrons and holes in the layer containing a light emitting substance may be provided in addition to these layers.

Each of the hole injecting layer 410, the hole transporting layer 411, the electron transporting layer 412, and the electron injecting layer 413 are not necessarily required to be provided and a layer having a plurality of functions may be formed instead. It is to be noted the buffer layer 401 and the layers 420, 422, 424, and 426 containing light emitting substances are preferably formed at certain distances.

There are roughly two kinds of structures for a layer containing a light emitting substance. That is, one structure is a host-guest type in which a light emitting substance (dopant) is dispersed in a material (host) having a larger band gap than the light emitting substance and the other is a structure formed only of a light emitting substance. Either of the aforementioned structures can be employed for the invention.

Next, description is made of the buffer layer 401. By controlling the thickness of the buffer layer 401, an optical path length of light reflected by a reflective electrode is controlled. The light reflected by the reflective electrode causes interference with light directly emitted (to the) outside (from) the light emitting element. By controlling the thickness of the buffer layer 401 to adjust the phases of the light directly emitted (to the) outside (from) the light emitting element and the light reflected by the reflective electrode, light emission is amplified and higher luminance can be obtained when the same current is supplied. That is, light emission efficiency can be improved.

Moreover, the phases of light are matched at a certain wavelength, therefore, color purity is improved. That is, a light emission spectrum of the light emitting layer becomes sharp. Therefore, by matching an absorption spectrum of the color conversion layer to the light emission spectrum, the color conversion layer can efficiently absorb light emission from the light emitting layer. As a result, light emission efficiency can be improved.

The buffer layer 401 is formed of a composite material of an organic compound having a hole transporting property and a metal compound. As the metal compound, oxide or nitride of a transition metal is preferably used, and more preferably, oxide or nitride of a metal which belongs to groups 4 to 8 of the periodic table of elements is used. In particular, vanadium oxide, tantalum oxide, molybdenum oxide, tungsten oxide, rhenium oxide, or ruthenium oxide is preferable. As the organic compound having a hole transporting property, an organic material having an arylamino group such as 4,4'-bis[N-(1-napthyl)-N-phenylamino]biphenyl (abbreviation: NPB), 4,4'-bis[N-(3-methylphenyl)-N-phenylamino]biphenyl (abbreviation: TPD), 4,4',4"-tris(N,N-diphenylamino)triphenylamine (abbreviation: TDATA), 4,4',4"-tris[N-(3-methylphenyl)-N-phenylamino]triphenylamine (abbreviation: MTDATA), 4,4'-bis{N-[4-(N,N-di-m-tolylamino)phenyl]-N-phenylamino}biphenyl (abbreviation: DNTPD), 1,3,5-tris[N,N-di(m-tolyl)amino]benzene (abbreviation: m-MTDAB), 4,4',4"-tris(N-carbazolyl)triphenylamine (abbreviation: TCTA), phthalocyanine (abbreviation: H$_2$Pc), copper phthalocyanine (CuPc), vanadyl phthalocyanine (abbreviation: VOPc), or the like can also be used.

In addition, such an organic material that will be represented by the following general formula (1) can also be preferably used. As the specific examples, 3-[N-(9-phenylcarbazole-3-yl)-N-phenylamino]-9-phenylcarbazole (abbreviation: PCzPCA1), 3,6-bis[N-(9-phenylcarbazole-3-yl)-N-phenylamino]-9-phenylcarbazole (abbreviation: PCzPCA2), and the like can be given. The first composite material using an organic compound having this structure is superior in thermal stability and reliability.

[Chemical Formula 1]

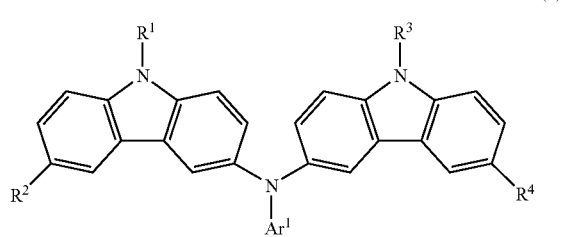

(1)

(In the formula, each of $R^1$ and $R^3$ may be the same or different, which represents any of hydrogen; an alkyl group having 1 to 6 carbon atoms; an aryl group having 6 to 25 carbon atoms; a heteroaryl group having 5 to 9 carbon atoms; an arylalkyl group; and an acyl group having 1 to 7 carbon atoms, $Ar^1$ represents any of an aryl group having 6 to 25 carbon atoms and a heteroaryl group having 5 to 9 carbon atoms, $R^2$ represents any of hydrogen; an alkyl group having 1 to 6 carbon atoms; and an aryl group having 6 to 12 carbon atoms, and $R^4$ represents any of hydrogen; an alkyl group having 1 to 6 carbon atoms; an aryl group having 6 to 12 carbon atoms; and a substituent that will be represented by a general formula (2).)

[Chemical Formula 2]

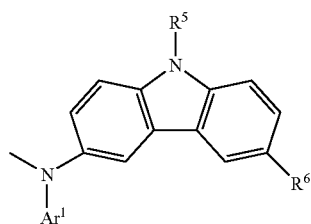

(2)

(In the substituent represented by the general formula (2), $R^5$ represents any of hydrogen; an alkyl group having 1 to 6 carbon atoms; an aryl group having 6 to 25 carbon atoms; a heteroaryl group having 5 to 9 carbon atoms; an arylalkyl group; and an acyl group having 1 to 7 carbon atoms, Ar represents any of an aryl group having 6 to 25 carbon atoms and a heteroaryl group having 5 to 9 carbon atoms, and $R^6$ represents any of hydrogen; an alkyl group having 1 to 6 carbon atoms; and an aryl group having 6 to 12 carbon atoms.)

In addition, such an organic material that will be represented by any of the following general formulas (3) to (6) can also be preferably used. As the specific examples of such an organic compound that will be represented by any of the following general formulas (3) to (6), N-(2-naphthyl)carbazole (abbreviation: NCz), 4,4'-di(N-carbazolyl)biphenyl (abbreviation: CBP), 9,10-bis[4-(N-carbazolyl)phenyl]anthracene (abbreviation: BCPA), 3,5-bis[4-(N-carbazolyl)phenyl]biphenyl (abbreviation: BCPBi), 1,3,5-tris[4-(N-carbazolyl)phenyl]benzene (abbreviation: TCPB), and the like can be given.

[Chemical Formula 3]

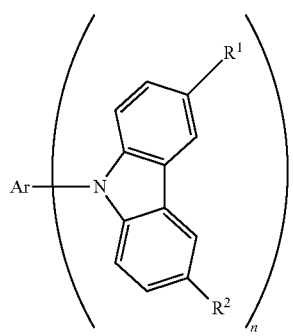

(3)

(In the formula, Ar represents an aromatic hydrocarbon group having 6 to 42 carbon atoms, n represents a natural number of 1 to 3, and $R^1$ and $R^2$ represent hydrogen; an alkyl group having 1 to 4 carbon atoms; or an aryl group having 6 to 12 carbon atoms.)

[Chemical Formula 4]

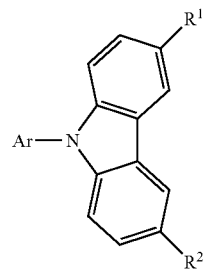

(4)

(In the formula, Ar represents a monovalent aromatic hydrocarbon group having 6 to 42 carbon atoms, and $R^1$ and $R^2$ represent hydrogen; an alkyl group having 1 to 4 carbon atoms; or an aryl group having 6 to 12 carbon atoms.)

[Chemical Formula 5]

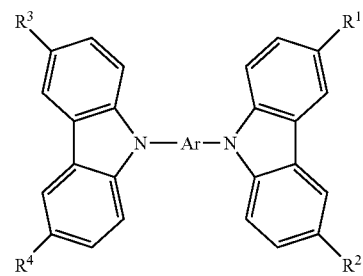

(5)

(In the formula, Ar represents a bivalent aromatic hydrocarbon group having 6 to 42 carbon atoms, and $R^1$ to $R^4$ represent hydrogen; an alkyl group having 1 to 4 carbon atoms; or an aryl group having 6 to 12 carbon atoms.)

[Chemical Formula 6]

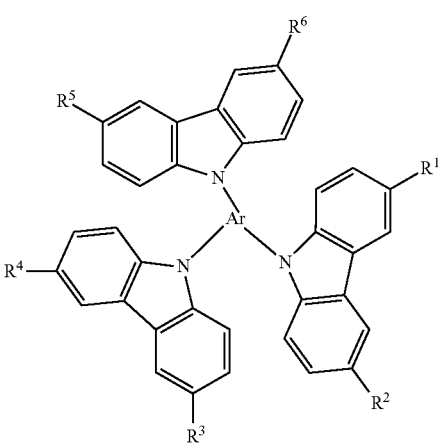

(6)

(However, in the formula, Ar represents a trivalent aromatic hydrocarbon group having 6 to 42 carbon atoms, and $R^1$ to $R^6$ represents hydrogen; an alkyl group having 1 to 4 carbon atoms; or an aryl group having 6 to 12 carbon atoms.)

Further, it is also possible to use aromatic hydrocarbon such as anthracene, 9,10-diphenylanthracene (abbreviation: DPA), 2-tert-butyl-9,10-di(2-naphthyl)anthracene (abbreviation: t-BuDNA), tetracene, rubrene, or pentacene.

Although the buffer layer 401 can be formed by a co-evaporation method with the above metal compound and organic compound having a hole-transporting property, the buffer layer 401 may be formed by any of a wet method and other methods. Note that, in the buffer layer 401, it is desirable that the organic compound and metal compound have a weight ratio of 95:5 to 20:80, and more desirably 90:10 to 50:50.

In the case where the buffer layer 401 is provided on a side of an electrode which functions as a cathode with respect to the light emitting layer 402, it is preferable that the buffer layer 401 be formed to have a two-layer structure. In specific, a layer which has a function to generate an electron is provided so as to be in contact with the light emitting layer 402. The layer which has a function to generate an electron may be formed of a light-transmissive material or a composite material of an organic compound having an electron transporting property and an inorganic compound. As the inorganic compound, an alkaline metal and an alkaline earth metal, or oxide and nitride containing the metals are desirable, and specifically, lithium, sodium, potassium, cesium, magnesium, calcium, strontium, barium, lithium oxide, magnesium nitride, or calcium nitride is preferably used. In addition, as the organic compound having an electron-transporting property, a material formed of a metal complex or the like having a quinoline skeleton or a benzoquinoline skeleton such as tris(8-quinolinolato)aluminum (abbreviation: $Alq_3$), tris(4-methyl-8-quinolinolato)aluminum (abbreviation: $Almq_3$), bis(10-hydroxybenzo[h]-quinolinato)beryllium (abbreviation: $BeBq_2$), or bis(2-methyl-8-quinolinolato)-4-phenylphenolato-aluminum (abbreviation: BAlq), or the like can be used. Besides, a material such as a metal complex having an oxazole-based ligand or a thiazole-based ligand such as bis[2-(2-hydroxyphenyl)benzoxazolato]zinc (abbreviation: $Zn(BOX)_2$) or bis[2-(2-hydroxyphenyl)benzothiazolato]zinc (abbreviation: $Zn(BTZ)_2$) can also be used. Further, other than the metal complex, 2-(4-biphenylyl)-5-(4-tert-buthylphenyl)-1,3,4-oxadiazole (abbreviation: PBD), 1,3-bis[5-(4-tert-buthylphenyl)-1,3,4-oxadiazol-2-yl]benzene (abbreviation: OXD-7), 3-(4-tert-buthylphenyl)-4-phenyl-5-(4-biphenylyl)-1,2,4-triazole (abbreviation: TAZ), 3-(4-tert-buthylphenyl)-4-(4-ethylpheyl)-5-(4-biphenylyl)-1,2,4-triazole (abbreviation: p-EtTAZ), bathophenanthroline (abbreviation: BPhen), bathocuproin (abbreviation: BCP), or the like can be used.

The thickness of the buffer layer 401 is set so that the light emission efficiency of the light emitting device is improved. In specific, when an optical distance between a light emitting region and a reflective electrode is L and a desired wavelength is λ, the thickness is set so that $L=(2m-1)\lambda/4$ (m is a natural number of 1 or larger) is satisfied. Further, the optical length L between the light emitting region and the reflective electrode is set in a range of $d_1 \leq L \leq d_2$ when a distance from an interface between the light emitting layer 402 and the buffer layer 401 to the first electrode 400 is $d_1$ and a distance from an interface between the light emitting layer 402 and the second electrode 403 to the first electrode 400 is $d_2$ ($d_1 < d_2$). When there are a plurality of layers formed of different materials, the thickness is set so that the sum of each optical distance satisfies the aforementioned formula. The optical distance is calculated by "actual distance×refractive index at the wavelength λ".

In the case where the buffer layer 401 is quite thick or has high conductivity, a cross talk may occur between adjacent elements depending on the density of forming light emitting elements. In such a case, the buffer layer 401 only is preferably patterned and provided independently in each pixel. However, such a cross talk is not a big problem in a normal structure.

A light emitting region exists somewhere in a layer containing a light emitting substance, but it is difficult to determine where it is specifically. However, by assuming an appropriate position of the layer containing a light emitting substance as a light emitting region, an effect of the invention can be sufficiently obtained. In the case where a light emitting region is required to be specified more closely, estimating the position of the light emitting region as described below can achieve more accurate optical control.

Figure 3A:
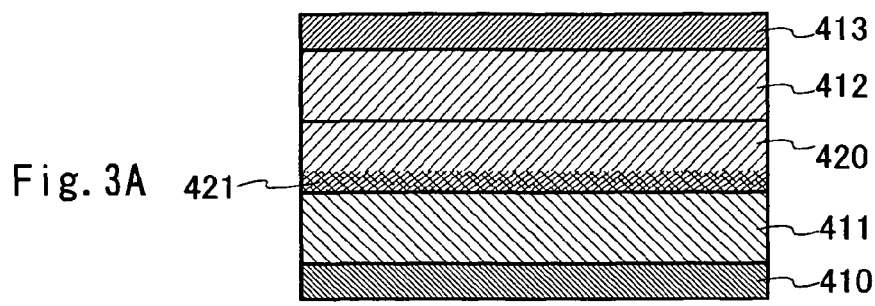
FIGS. 3A to 3D are cross sectional schematic views of light emitting layers.
Figure 3B:
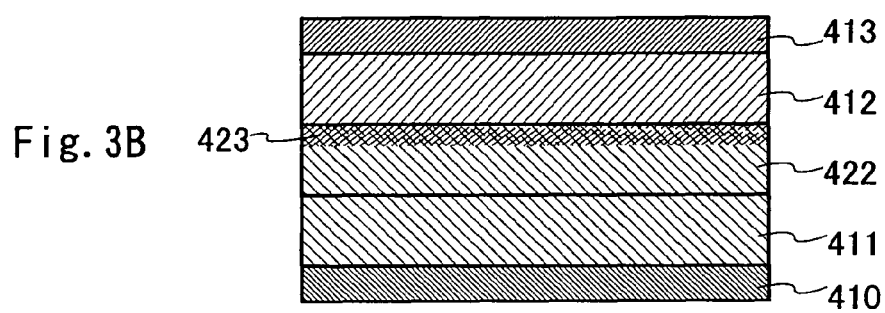
Figure 3C:
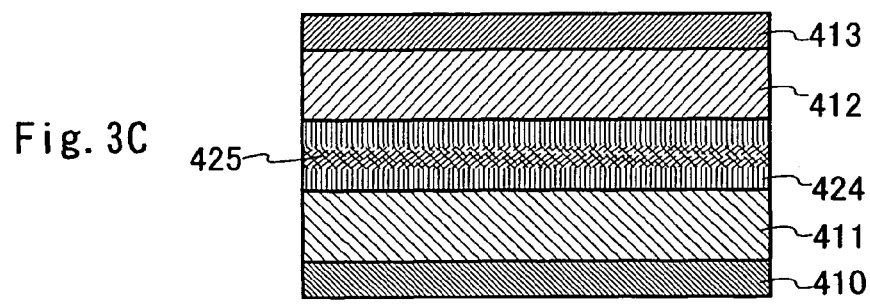
Figure 3D:
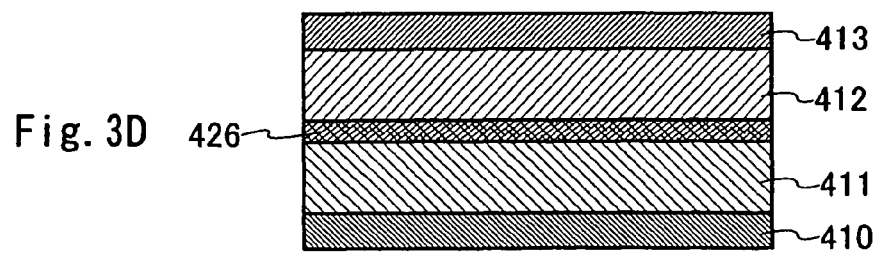

FIGS. 3A to 3D are schematic views each showing where a light emitting region exists depending on a host material of the layer containing a light emitting substance. It is to be noted that the layers containing light emitting substances shown in FIGS. 3A to 3C are host-guest type while the layer containing a light emitting substance shown in FIG. 3D is a type formed only of a light emitting substance.

FIG. 3A is a view showing the case where a host material of the layer 420 containing a light emitting substance is a material having an electron transporting property. In this case, it is considered that a light emitting region 421 is formed on a side close to the hole transporting layer 411 of the layer 420 containing a light emitting substance. FIG. 3B shows the case where a host material of the layer 422 containing a light emitting substance is formed of a material having a hole transporting property. In this case, in a light emitting region 423, the host material of the layer 422 containing a light emitting substance is considered to be formed on a side close to the electron transporting layer 412. FIG. 3C shows the case where a host material of the layer 424 containing a light emitting substance is formed of a bipolar material. In this case, it is difficult to estimate the position of the light emitting region 425, therefore, the center of the layer 424 containing a light emitting substance is preferably assumed to be the light emitting region 425. Alternatively, the light emitting region 425 is preferably assumed to be slightly on the electron transporting layer 412 side when a hole transporting property of the host material is higher than an electron transporting property thereof in consideration of a balance of a carrier transporting property of the host material being used, or slightly on the hole transporting layer 411 side in the opposite case. FIG. 3D shows the case where a layer 426 containing a light emitting substance is formed only of a light emitting substance. In this case, when the light emitting substance has a hole transporting property, the light emitting region is on the electron transporting layer side and when the light emitting substance has an electron transporting property, the light emitting region is on the hole transporting layer side. However, similarly to FIG. 3C, it is difficult to estimate the position of the light emitting region. Therefore, the center of the layer 426 containing a light emitting substance is preferably assumed to be a light emitting region. Alternatively, the light emitting region 425 is preferably assumed to be slightly on the electron transporting layer 412 side when a hole transporting property of the host material is higher than an electron transporting property thereof in consideration of a balance of a carrier transporting property of the host material being used, or slightly on the hole transporting layer 411 side in the opposite case. It is to be noted in the case where a position of a light emitting region is determined by other experiments and the like, the position can be used without employing the aforementioned estimate.

The aforementioned composite material can be quite preferably used as the buffer layer 401 because a driving voltage is not increased even when a thickness thereof is formed thick. A light emitting element of the invention which uses such a composite material as the buffer layer 401 can control an optical path length without drastically increasing a driving voltage, therefore, a light emitting device with high light emission efficiency and color purity and a low driving voltage can be provided.

One of the big problems of a light emitting device which uses a light emitting element including a pair of electrodes which sandwich a layer containing an organic compound is a life of a light emitting element, that is reliability of a long use. With high light emission efficiency, the same luminance can be obtained with a small current density as compared to a light emitting device with low light emission efficiency. Therefore, the life of the light emitting device can be longer and the reliability of a long use can be improved. In addition, a driving voltage is a very important factor for a light emitting device of which application for mobile devices is expected in particular. As described above, a light emitting device of the invention with high light emission efficiency and a low driving voltage has a great advantage in a mobile device application in particular.

Description is made on other structures of this embodiment mode. The substrate 100 and the counter substrate 113 in FIG. 1A are used as support bases for a thin film transistor and a light emitting element and can be formed of glass, quartz, plastic (polyimide, acrylic, polyethylene terephthalate, polycarbonate, polyacrylate, polyether sulfone, and the like), and the like. In addition, other materials may also be used as long as they can be used as a support base of a thin film transistor and a light emitting element. Moreover, the substrate may be polished by CMP or the like as required.

A base insulating film may be provided in a single layer or multi layers between the substrate 100 and the semiconductor layer 102. The base insulating film is provided to prevent an element which adversely affects the characteristics of a semiconductor film, such as alkali metal or alkaline earth metal from dispersing in the semiconductor layer. The base insulating film can be formed of silicon oxide, silicon nitride, silicon oxide containing nitrogen, silicon nitride containing oxygen, or the like. It is to be noted that the base insulating layer is not required to be provided when dispersion of impurities from the substrate is not a problem.

A top gate type thin film transistor is shown as an example in the invention, however, other existing thin film transistors such as a bottom gate type (inversely staggered type) thin film transistor may also be used. The invention is not limited to the kind and driving method of a transistor for driving the light emitting element.

The interlayer insulating film 105 is provided to prevent a thin film transistor and a light emitting element from electrically contacting each other in an unnecessary portion. The interlayer insulating film 105 may be formed of a single layer or multi layers. It is preferable that at least one layer of the interlayer insulating film 105 be formed of a material having a self-planarizing property so that projections and depressions produced by a thin film transistor formed beneath or the like can be smoothed. For example, acrylic, polyimide, an organic group having a skeletal structure formed of a bond of silicon and oxygen, and a material which includes, as a substituent, an organic group containing at least hydrogen (for example, an alkyl group or an aryl group), a fluoro group, or an organic group containing at least hydrogen and a fluoro group, namely a material such as siloxane is preferably used. Moreover, as other materials, silicon oxide, silicon nitride, silicon oxide containing silicon nitride, silicon nitride containing silicon oxide, a low dielectric material, or the like can be used.

The first electrode 107 and the second electrode 110 of the light emitting element can be formed of metal, alloy, a conductive compound, or a mixture of these. For example, a conductive metal such as aluminum (Al), silver (Ag), gold (Au), platinum (Pt), nickel (Ni), tungsten (W), chromium (Cr), molybdenum (Mo), iron (Fe), cobalt (Co), copper (Cu), palladium (Pd), lithium (Li), cesium (Cs), magnesium (Mg), calcium (Ca), strontium (Sr), and titanium (Ti), alloy such as aluminum-silicon (Al—Si), aluminum-titanium (Al—Ti), and aluminum-silicon-copper (Al—Si—Cu), nitride of a metal material such as titanium nitride (TiN), a metal compound such as indium tin oxide (ITO), indium tin oxide containing silicon oxide (ITSO), indium zinc oxide (IZO) obtained by mixing zinc oxide (ZnO) in indium oxide by 2 to 20 wt %, and the like can be used. However, in the case where the first electrode 107 functions as an electrode to which a high voltage is applied when the light emitting element emits light (an electrode which functions as an anode), the first electrode 107 is preferably formed of a material having a high work function (work function of 4.0 eV or higher). Meanwhile, in the case where the first electrode 107 functions as an electrode to which a low voltage is applied when the light emitting element emits light (an electrode which functions as a cathode), the first electrode 107 is preferably formed of a material having a low work function (work function of 3.8 eV or lower).

It is to be noted that an electrode from which light is extracted is preferably formed of a light-transmissive conductive material such as ITO, ITSO, and IZO. Aluminum, silver, or the like does not transmit light when formed into a thick film, however, aluminum or silver formed into a thin film which transmits light may also be used as a light-transmissive electrode. In this embodiment mode, the second electrode 110 is formed of a light-transmissive conductive material in order to extract light emission from the second electrode 110 side of the light emitting element. Moreover, an electrode which functions as a reflective electrode is preferably formed of a highly reflective conductive material (reflectivity of light emitted from the light emitting layer is 70% or more) such as aluminum or silver. It is needless to say that aluminum or silver is formed thick enough not to have light transmittance when used as a reflective electrode.

Figure 2B:
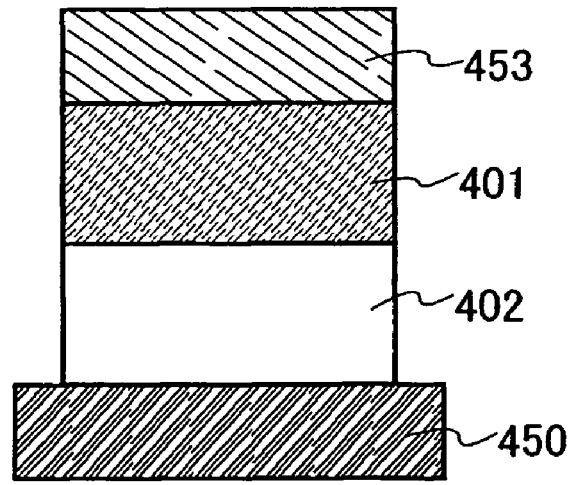

The layer 109 containing an organic compound is formed of the buffer layer 401 and the light emitting layer 402 as shown in FIGS. 2A and 2B. The structure of the buffer layer 401 is as described above. The light emitting layer 402 is formed of a single layer or stacked layers containing at least a light emitting substance.

The stacked-layer structure of the light emitting layer 402 is typically a functionally separated type structure as shown in FIGS. 3A to 3D. By providing a layer formed of a material having a high hole transporting property on an anode side and a layer formed of a material having a high electron transporting property on a cathode side, between which a layer containing a light emitting substance where holes and electrons are recombined is sandwiched, holes and electrons can be transported efficiently and holes and electrons can be recombined at a higher probability.

A substance which can be used for forming the hole injecting layer 410 is, in specific, phthalocyanine (abbreviation: H$_2$Pc), a phthalocyanine-based compound such as copper phthalocyanine (abbreviation: CUPC), a high molecular compound such as poly(ethylenedioxthiophene)/poly(styrenesulfonate) aqueous (PEDOT/PSS), and the like can be used. The hole injecting layer can be formed by selecting a substance which makes the ionization potential of a material used for the hole injecting layer relatively smaller than the ionization potential of the hole transporting layer among substances having hole transporting properties.

As a specific example of a substance for forming the hole transporting layer 411, 4,4'-bis[N-(1-naphtyl)-N-phenylamino]biphenyl (abbreviaton: α-NPD), 4,4'-bis[N-(3-methylphenyl)-N-phenylamino]biphenyl (abbreviaton: TPD), 4,4',4''-tris(N,N-diphenylamino) triphenylamine (abbreviaton: TDATA), 4,4',4''-tris[N-(3-methylphenyl)-N-phenylamino]triphenylamine (abbreviaton: MTDATA), 4,4'-bis{N-[4-(N,N-di-m-tolylamino)phenyl]-N-phenylamino}biphenyl (abbreviaton: DNTPD), 1,3,5-tris[N,N-di(m-tolyl)amino]benzene (abbreviaton: m-MTDAB), 4,4',4''-tris(N-carbazolyl)triphenylamine (abbreviaton: TCTA), phthalocyanine (abbreviaton: $H_2Pc$), copper phthalocyanine (abbreviaton: CuPc), vanadyl phthalocyanine (abbreviaton: VOPC), or the like can be used. Further, the hole transporting layer 411 can be formed of a multi-layer structure formed by stacking two or more of layers formed of the aforementioned substances.

By providing the hole transporting layer 411, a distance can be provided between the first electrode 107 and the layer containing a light emitting substance, which prevents light emission from going out because of a metal contained in the first electrode 107. The hole transporting layer 411 is preferably formed of a substance having a high hole transporting property, in particular, a substance having a hole mobility of 10 to $1 \times 10^{-6}$ cm$^2$ vs.

There are two aspects in the layers which function as the layers 420, 422, 424, and 426 containing light emitting substances. One is a host-guest type layer (420, 422, and 424) which contains a light emitting material dispersedly in a layer formed of a material having a larger energy gap (host material) than an energy gap of a light emitting substance as a light emission center, and the other is a layer (426) having a light emitting layer formed only of a light emitting substance. The former is a preferable structure since concentration light extinction does not easily occur. A structure where light of a near-ultraviolet region to a blue-green region is emitted from a light emitting layer is selected for a light emitting device of the invention. As such a light emitting material, a coumarin derivative, an oligophenylene derivative, an oxazole derivative, a stilbene derivative, a quinolone derivative, an acridone derivative, an anthracene derivative, a pyrene derivative, a phenanthrene derivative and the like are preferably used. The dopant is added in a small amount, in specific, at 0.001 to 50 wt %, preferably 0.03 to 20 wt % with respect to a host material. Furthermore, as a host material which functions as a host body when a layer formed by dispersing the aforementioned light emitting materials, a tetraaryl silane derivative, a dinaphthalene derivative, a pyrene derivative, an oligothiophene derivative, a benzophenone derivative, a benzonitrile derivative, and the like can be used.

As specific examples of a substance which can be used for forming the electron transporting layer 412 are, tris(8-quinolinolato)aluminum (abbreviation: $Alq_3$); tris(4-methyl-8-quinolinolato)aluminum (abbreviation: $Almq_3$); bis(10-hydroxybenzo[h]-quinolinato)beryllium (abbreviation: $BeBq_2$); bis(2-methyl-8-quinolinolato)-4-phenylphenolato-aluminum (abbreviation: BAlq); bis[2-(2-hydroxyphenyl)benzoxazolato]zinc (abbreviation: $Zn(BOX)_2$); or bis[2-(2-hydroxyphenyl)benzothiazolato]zinc (abbreviation: $Zn(BTZ)_2$), an oxadiazole derivative such as 2-(4-biphenylyl)-5-(4-tert-buthylphenyl)-1,3,4-oxadiazole (abbreviation: PBD) or 1,3-bis[5-(4-tert-buthylphenyl)-1,3,4-oxadiazol-2-yl]benzene (abbreviation: OXD-7), a triazole derivative such as 3-(4-biphenylyl)-4-phenyl-5-(4-tert-buthylphenyl)-1,2,4-triazole (abbreviation: TAZ) or 3-(4-biphenylyl)-4-(4-ethylpheyl)-5-(4-tert-buthylphenyl)-1,2,4-triazole (abbreviation: p-EtTAZ), bathophenanthroline (abbreviation: BPhen), bathocuproin (abbreviation: BCP), 2,2',2''-(1,3,5-benzenetriyl)-tris(1-phenyl-1H-benzimidazole) (abbreviation: TPBI), or 4,4-bis(5-methylbenzoxazol-2-yl)stilbene (abbreviation: BzOs), and the like. Further, the electron transporting layer can be formed of a multi-layer structure formed by stacking two or more of layers formed of the aforementioned materials.

By providing the electron transporting layer 412, a distance can be provided between the second electrode 110 and the light emitting layer, which prevents light emission from going out because of a metal contained in the second electrode 110. The electron transporting layer 412 is preferably formed of a substance having a high electron transporting property, in particular, a substance having an electron mobility of 10 to $1 \times 10^6$ cm$^2$ vs.

As specific examples of a substance which can be used for forming an electron injecting layer 413, inorganic materials such as alkali metal, alkaline earth metal, fluoride of alkali metal, fluoride of alkaline earth metal, oxide of alkali metal, and oxide of alkali earth metal can be given. In addition to the inorganic materials, a substance which can be used for forming an electron transporting layer such as BPhen, BCP, p-EtTAZ, TAZ, and BzOs can be used to form an electron injecting layer by selecting a substance having higher electron affinity than that of a substance used for forming an electron transporting layer. That is, an electron injecting layer can also be formed by selecting a substance having electron affinity which is relatively higher than that of an electron transporting layer from substances having electron transporting properties.

The first electrode 107 of the light emitting element has end portions covered with the partition 108. Portions of the first electrode 107, which are not covered with the partition 108 correspond to a light emitting region of the light emitting element. The partition 108 can be formed of a similar material to the material described as a material for the interlayer insulating film 105.

The connecting portion 106 which electrically connects the first electrode 107 of the light emitting element and the thin film transistor is formed of a single layer or multi layers of aluminum, copper, alloy of aluminum, carbon, and nickel, alloy of aluminum, carbon, and molybdenum, and the like. In the case of a multi-layer structure, for example, from the thin film transistor side, a stacked-layer structure of molybdenum, aluminum and molybdenum, a stacked-layer structure of titanium, aluminum and titanium, or a stacked-layer structure of titanium, titanium nitride, aluminum and titanium can be suggested.

A light emitting device is completed by sealing the aforementioned elements formed over the substrate 100 with the counter substrate 113 from an external atmosphere by using a sealing material which is not shown. The color conversion layer (green) 111 and the color conversion layer (red) 112 are provided over the counter substrate 113 for each light emitting element. Light emitted from the light emitting element enters the color conversion layer (green) 111 or the color conversion layer (red) 112. The color conversion layer absorbs the light emitted from the light emitting element and photoluminescence is generated. In this manner, light emission of green or red can be obtained and a light emitting device which performs full color display realized by three colors of green and red which are converted by the color conversion layers and blue emitted from the light emitting element can be provided. The counter substrate 113 can be formed of a similar material to that of the substrate 100.

As the color conversion layer in this embodiment mode, two kinds of layers are used: a layer containing a substance which absorbs light in a blue region and emits fluorescence in a red region and a layer containing a substance which absorbs light in a blue region and emits fluorescence in a green region. As a substance which absorbs light in a blue region and emits fluorescence in a red region, for example, rhodamine-based pigment such as rhodamine B, rhodamine 6G, rhodamine 3B, rhodamine 101, rhodamine 110, sulforhodamine, basic violet 11, and basic red 2, cyanine-based pigment, pyridine-based pigment such as 1-ethyl-2-[4-(p-dimethylaminophenyl)-1,3-butadienyl]pyridiniumperchlorate(pyridine1), oxazine-based pigment, or the like can be used. Moreover, other pigments having a property to absorb light in a blue region and emit fluorescence in a red region may also be used. A substance which absorbs light in a blue region and emits fluorescence in a green region is, for example, coumarin-based pigment such as coumarin 6, coumarin 7, coumarin 30, and coumarin 153, coumarin pigment-based dye such as basic yellow 51, naphthalimido-based dye such as solvent yellow 11 and solvent yellow 116, and the like can be used. Moreover, other pigments having a property to absorb light in a blue region and emit fluorescence in a green region may also be used.

A resin to be a backing material for dissolving or dispersing a color conversion layer is, a light-transmissive resin such as polymethyl methacrylate resin, polyacrylate resin, polycarbonate resin, polyvinyl alcohol resin, polyvinyl pyrrolidone resin, hydroxyethyl cellulose resin, carboxymethyl cellulose resin, poly vinyl chloride resin, melamine resin, phenol resin, alkyd resin, epoxy resin, polyurethane resin, polyester resin, maleic acid resin, and polyamide resin can be used. Moreover, ionizing radiation curable resin containing an acrylate-based, methacrylate-based, poly(vinyl cinnamate)-based, or cyclorubber-based poly reactive vinyl group may also be used.

In a light emitting device of the invention having the aforementioned structure, a driving voltage does not drastically increase even when a buffer layer is formed thick. Therefore, a light emitting device with high light emission efficiency and color purity and a low driving voltage can be provided by controlling an optical path length of light in a light emitting element.

One of the big problems of a light emitting device which uses a light emitting element including a pair of electrodes which sandwich a layer containing an organic compound is a life of a light emitting element, that is reliability of a long use. With high light emission efficiency, the same luminance can be obtained with a small current density as compared to a light emitting device with low light emission efficiency. Therefore, the life of the light emitting device can be longer and the reliability of a long use can be improved. In addition, a driving voltage is a very important factor for a light emitting device of which application for mobile devices is expected in particular. As described above, a light emitting device of the invention with high light emission efficiency and a low driving voltage has a great advantage in a mobile device application in particular.

Embodiment Mode 2

Figure 1B:
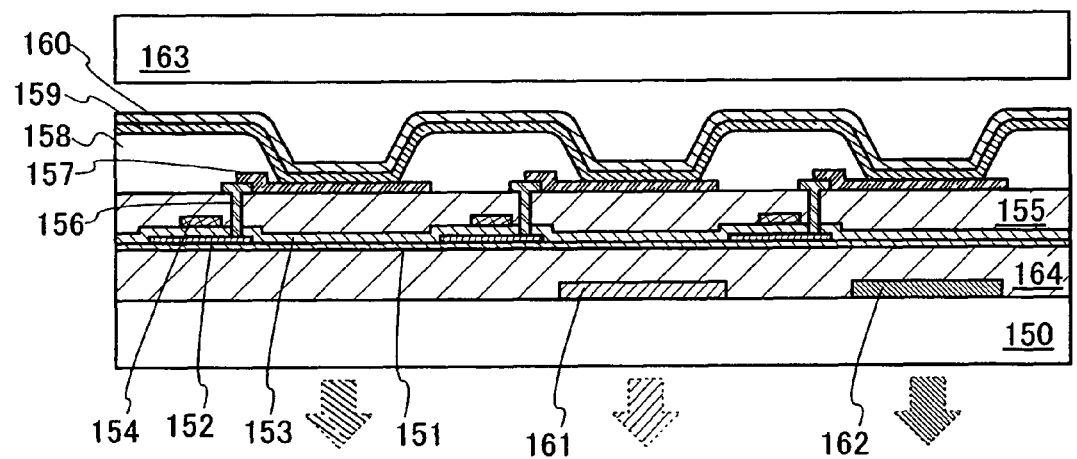

FIG. 1B is a view showing a light emitting device of the invention with a different structure from FIG. 1A. The light emitting device of the invention shown in FIG. 1B includes a substrate 150, a base insulating film 151, a semiconductor layer 152, a gate insulating film 153, a gate electrode 154, an interlayer insulating film 155, a connecting portion 156, a first electrode 157 of a light emitting element, a partition 158, a layer 159 containing an organic compound, a second electrode 160 of the light emitting element, a color conversion layer (green) 161, a color conversion layer (red) 162, a counter substrate 163, and a depression/projection smoothing layer 164. In this embodiment mode, a bottom emission type light emitting device in which the light emitting element emits light to the first electrode 157 side is shown as an example. In this embodiment mode, the first electrode 157 is formed of a light-transmissive conductive material in order to extract light from the first electrode 157 side while the second electrode 160 is formed of a highly reflective conductive material as a reflective electrode. For specific materials of these, Embodiment Mode 1 may be referred to.

The layer 159 containing an organic compound has a stacked-layer structure as shown in FIG. 2B. It is to be noted that a first electrode 450 in FIG. 2B corresponds to the first electrode 157 in FIG. 1B while a second electrode 453 in FIG. 2B corresponds to the second electrode 160 in FIG. 1B. Further, a stack of the buffer layer 401 and the light emitting layer 402 in FIG. 2B corresponds to the layer 159 containing an organic compound in FIG. 1B. That is, the layer 159 containing an organic compound is formed of a stack of the buffer layer 401 and the light emitting layer 402. The buffer layer 401 is provided on the second electrode 160 side which is a reflective electrode. In this case, the optical length L between the light emitting region and the reflective electrode is set in a range of $d_1 \leq L \leq d_2$ when a distance from an interface between the light emitting layer 402 and the buffer layer 401 to the second electrode 453 is $d_1$ and a distance from an interface between the light emitting layer 402 and the first electrode 450 to the second electrode 453 is $d_2$ ($d_1 < d_2$).

In this embodiment mode, light is emitted to the substrate 150 side, therefore, a color conversion layer is not provided for the counter substrate 163, and a color conversion layer (green) 161 and a color conversion layer (red) 162 are formed over the substrate 150. In the case where depressions and projections caused by providing the color conversion layers over the substrate adversely affect the following manufacture of elements, it is preferable to provide a depression/projection smoothing layer 164 which is formed of a material having a self-planarizing property such as acrylic, polyimide, or siloxane. The base insulating film 151 is not required to be provided in the case where the depression/projection layer 164 has a favorable insulating property and can sufficiently suppress dispersion of impurities from the substrate.

Other structures and effects are as described in Embodiment Mode 1; therefore, description thereof is omitted. The description in Embodiment Mode 1 is to be referred to.

Embodiment Mode 3

Figure 4A:
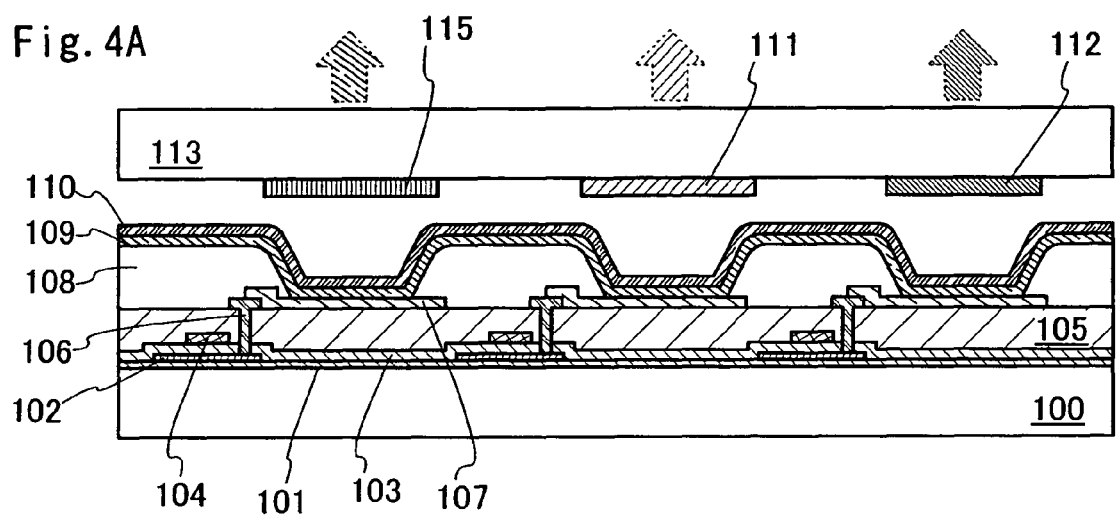
FIGS. 4A and 4B are cross sectional schematic views of a light emitting device of the invention.

FIG. 4A is a view showing a light emitting device of the invention with a different structure from FIG. 1A. The structure of this embodiment mode is almost the same as the structure described in Embodiment Mode 1, besides a blue color filter 115 is provided. When light is emitted from a light emitting layer through a blue color filter, color purity can be improved. This is a favorable structure with relatively less loss of light since the light emitted from the light emitting element has a wavelength in a region near a blue color. It is also a favorable structure that the light emitted from the light emitting element is adjusted to the absorption of the color conversion layer (green) 111 and the color conversion layer (red) 112 and color purity of blue color is improved with a color filter. It is to be noted in FIG. 4A that a sealing material is not shown.

The color filter 115 may be a color conversion layer (blue) for converting light of a near-ultraviolet region to a blue region into blue light. The color conversion layer (blue) can convert the light emission from the light emitting element into a blue color with high color purity. In this case, it is required that the light emission from the light emitting element be light emission containing a spectral component with a shorter wavelength than a desired blue color.

Other structures and effects are similar to Embodiment Mode 1, therefore, description thereof is omitted. The description in Embodiment Mode 1 is to be referred to.

Embodiment Mode 4

Figure 4B:
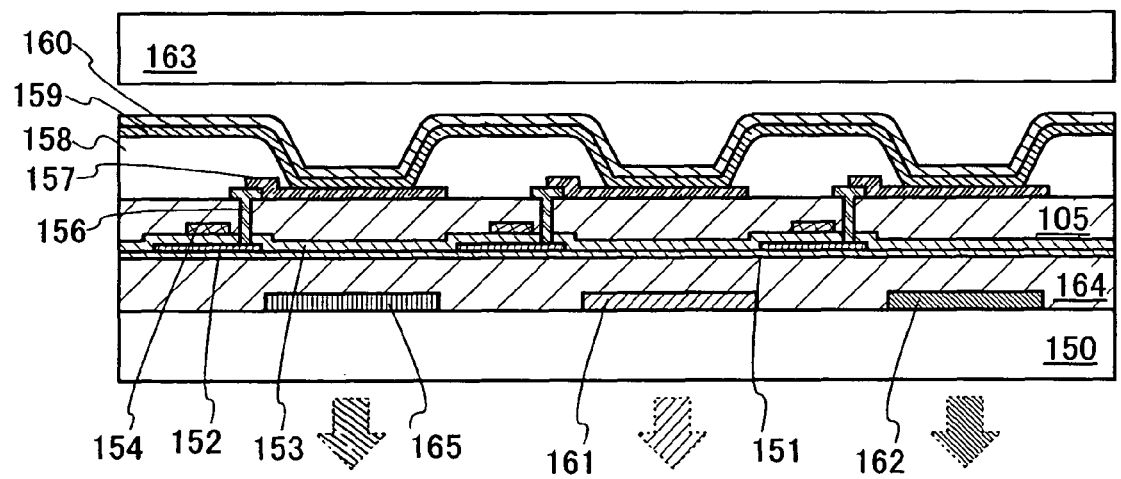

FIG. 4B is a view showing a light emitting device of the invention with a different structure from FIG. 1A. The structure of this embodiment mode is almost the same as the structure described in Embodiment Mode 2 (see FIG. 1B), besides a blue color filter 165 is provided. When light is emitted from a light emitting layer through a blue color filter, color purity can be improved. This is a favorable structure with less loss of light since the light emitted from the light emitting element has a wavelength in a region near a blue color. It is also a favorable structure that the light emitted from the light emitting element is adjusted to the absorption of the color conversion layer (green) 161 and the color conversion layer (red) 162 and color purity of blue color is improved with a color filter. It is to be noted in FIG. 4B that a sealing material is not shown.

The color filter 165 may be a color conversion layer (blue) for converting light of a near-ultraviolet region to a blue region into blue light. The color conversion layer (blue) can convert the light emission from the light emitting element into a blue color with high color purity. In this case, it is required that the light emission from the light emitting element be light emission containing a spectral component with a shorter wavelength than a desired blue color.

Other structures and effects are similar to Embodiment Mode 2, therefore, description thereof is omitted. The description in Embodiment Mode 2 is to be referred to.

Embodiment Mode 5

Figure 5A:
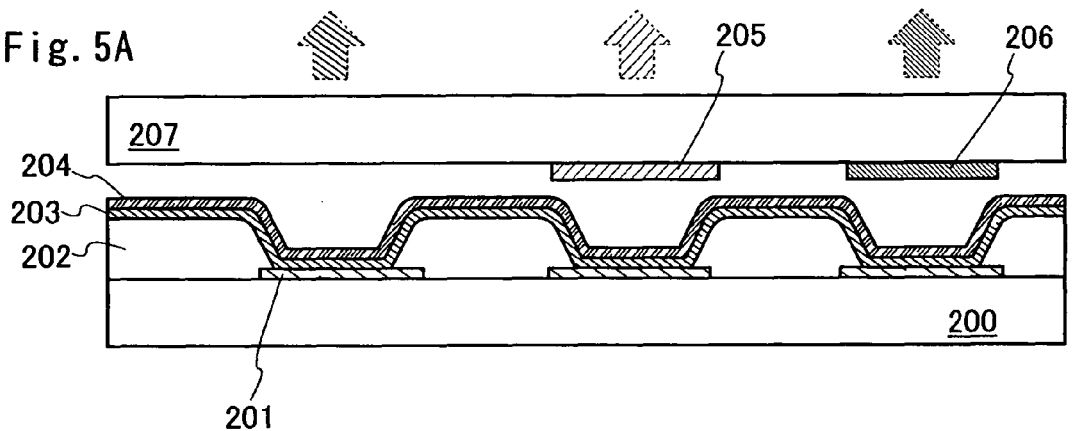
FIGS. 5A to 5C are cross sectional schematic views of a light emitting device of the invention.

FIG. 5A shows a structure of a light emitting device of the invention as an example. FIG. 5A shows a portion of a cross sectional view of a pixel portion of a passive matrix light emitting device with a tapered structure. The light emitting device of the invention shown in FIG. 5A includes a substrate 200, a first electrode 201 of a light emitting element, a partition 202, a layer 203 containing an organic compound, a second electrode 204 of a light emitting element, a color conversion layer (green) 205, a color conversion layer (red) 206, and a counter substrate 207. It is to be noted in FIG. 5A that a sealing material is not shown.

A light emitting element is formed in a portion where the layer 203 containing an organic compound is sandwiched between the first electrode 201 and the second electrode 204 of the light emitting element. The first electrode 201 and the second electrode 204 cross each other and are formed in stripe where light emitting elements are formed at intersection portions. The partition 202 is formed in parallel to the second electrode 204, thereby the light emitting element is insulated from another light emitting element having the first electrode 201 in common.

In this embodiment mode, the first electrode 201 functions as a reflective electrode formed of a highly reflective material (reflectivity of light emitted from the light emitting layer is 70% or more) while the second electrode 204 functions as a light-transmissive electrode formed of a light-transmissive conductive material. For specific materials of these, Embodiment Mode 1 may be referred to.

Besides, the substrate 200, the partition 202, the layer 203 containing an organic compound, the color conversion layer (green) 205, the color conversion layer (red) 206, and the counter substrate 207 in FIG. 5A correspond to the substrate 100, the partition 108, the layer 109 containing an organic compound, the color conversion layer (green) 111, the color conversion layer (red) 112, and the counter substrate 113 in FIG. 1A respectively. The structures, materials, and effects of these are similar to those of Embodiment Mode 1, therefore, description thereof is omitted. The description in Embodiment Mode 1 is to be referred to.

Embodiment Mode 6

In this embodiment mode, a comparable structure to Embodiment Mode 5 is described with reference to FIG. 5B. A light emitting device of the invention shown in FIG. 5B includes a substrate 250, a first electrode 251 of a light emitting element, a partition 252, a layer 253 containing an organic compound, a second electrode 254 of the light emitting element, a color conversion layer (green) 255, a color conversion layer (red) 256, and a counter substrate 257. It is to be noted in FIG. 5B that a sealing material is not shown. In this embodiment mode, a bottom emission type light emitting device in which the light emitting element emits light to the first electrode 251 side is shown as an example. In this embodiment mode, the first electrode 251 is formed of a light-transmissive conductive material in order to extract light from the first electrode 251 side while the second electrode 254 is formed of a highly reflective conductive material (reflectivity of light emitted from the light emitting layer is 70% or more) as a reflective electrode. For specific materials of these, Embodiment Mode 1 may be referred to.

The layer 253 containing an organic compound has a stacked-layer structure as shown in FIG. 2B. It is to be noted that a first electrode 450 in FIG. 2B corresponds to the first electrode 251 in FIG. 5B while the second electrode 453 in FIG. 2B corresponds to the second electrode 254 in FIG. 5B. Moreover, a stack of the buffer layer 401 and the light emitting layer 402 in FIG. 2B corresponds to the layer 253 containing an organic compound in FIG. 5B. That is, the layer 253 containing an organic compound is formed of a stack of the buffer layer 401 and the light emitting layer 402. The buffer layer 401 is provided on the second electrode 254 side which is a reflective electrode.

In this embodiment mode, light is emitted to the first electrode 251 side, that is the substrate 250 side, therefore, a color conversion layer is not provided for the counter substrate 257, and a color conversion layer (green) 255 and a color conversion layer (red) 256 are formed over the substrate 250. In the case where depressions and projections caused by providing the color conversion layers over the substrate adversely affect the following manufacture of elements, it is preferable to provide a depression/projection smoothing layer 258 which is formed of a material having a self-planarizing property such as acrylic, polyimide, and(or) siloxane.

Figure 5B:
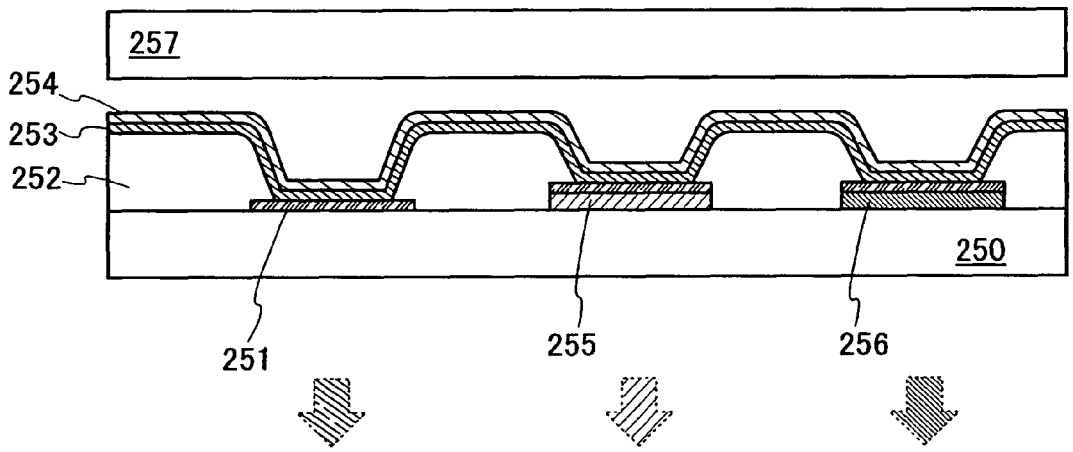
Figure 5C:
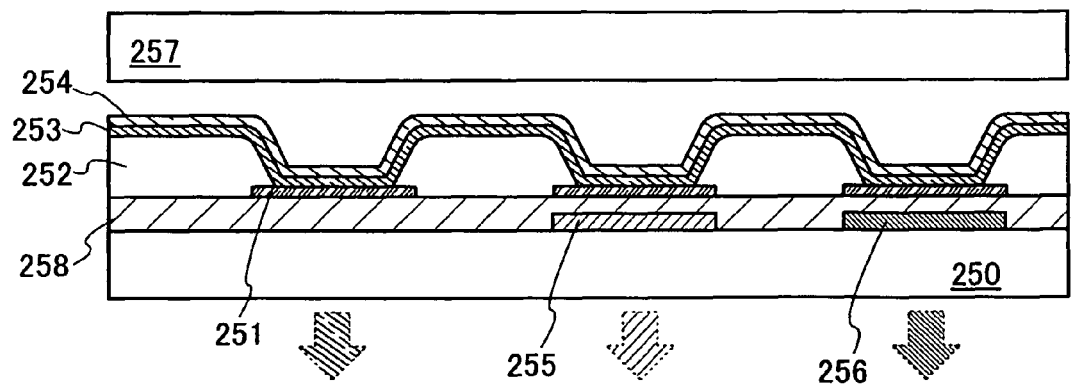

The substrate 250, the partition 252, the layer 253 containing an organic compound, the color conversion layer (green) 255, the color conversion layer (red) 256, and the counter substrate 257 in FIGS. 5B and 5C correspond to the substrate 150, the partition 158, the layer 159 containing an organic compound, the color conversion layer (green) 161, the color conversion layer (red) 162, and the counter substrate 163 in FIG. 1B respectively, and the depression/projection smoothing layer 258 in FIG. 5C corresponds to the depression/projection smoothing layer 164 in FIG. 1B. The structures, materials, and effects of these are similar to Embodiment Mode 2, therefore, description thereof is omitted. The description in Embodiment Mode 2 is to be referred to.

Embodiment Mode 7

Figure 6A:
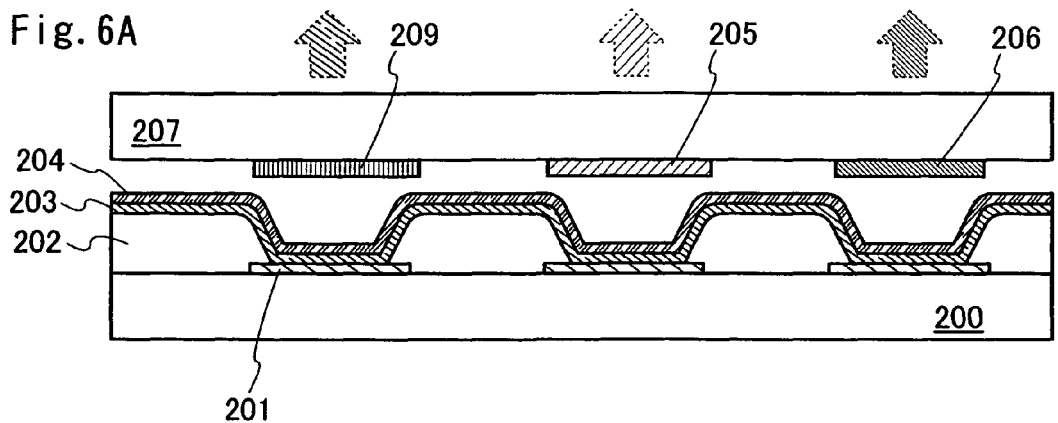
FIGS. 6A to 6C are cross sectional schematic views of a light emitting device of the invention.

FIG. 6A is a view showing a light emitting device of the invention with a comparable structure to Embodiment Mode 5. The structure of this embodiment mode is almost the same as the structure described in Embodiment Mode 5, besides a blue color filter 209 is provided. When light is emitted from a light emitting layer through a blue color filter, color purity can be improved. This is a favorable structure with relatively less loss of light since the light emitted from the light emitting element has a wavelength in a region near a blue color. It is also a favorable structure that the light emitted from the light emitting element is adjusted to the absorption of the color conversion layer (green) 205 and the color conversion layer (red) 206 and color purity of a blue color is improved with a color filter. It is to be noted in FIG. 6A that a sealing material is not shown.

The color filter 209 may be a color conversion layer (blue) for converting light of a near-ultraviolet region to a blue region into blue light. The color conversion layer (blue) can convert the light emission from the light emitting element into a blue color with high color purity. In this case, it is required that the light emission from the light emitting element be light emission containing a spectral component with a shorter wavelength than a desired blue color.

Other structures and effects are similar to those of Embodiment Mode 5, therefore, description thereof is omitted. The description in Embodiment Mode 5 is to be referred to.

Embodiment Mode 8

Figure 6B:
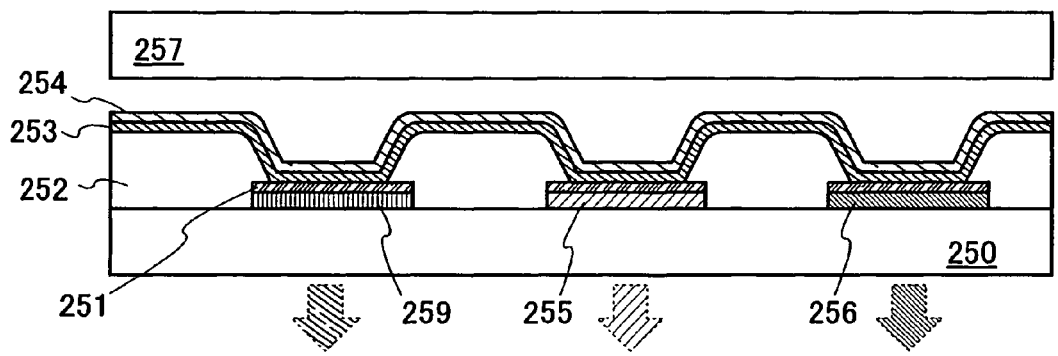
Figure 6C:
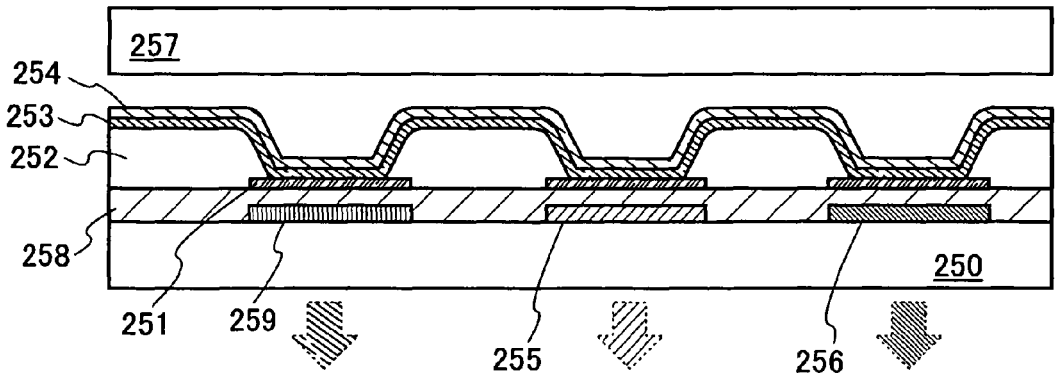

FIGS. 6B and 6C are views showing a light emitting device of the invention with a comparable structure to Embodiment Mode 6. The structure of this embodiment mode is almost the same as the structure described in Embodiment Mode 6 (see FIGS. 5B and 5C), besides a blue color filter 259 is provided. When light is emitted from a light emitting layer through a blue color filter, color purity can be improved. This is a favorable structure with relatively less loss of light since the light emitted from the light emitting element has a wavelength in a region near a blue color. It is also a favorable structure that the light emitted from the light emitting element is adjusted to the absorption of the color conversion layer (green) 255 and the color conversion layer (red) 256 and color purity of a blue color is improved with a color filter. It is to be noted in FIGS. 6B and 6C that a sealing material is not shown.

The color filter 259 may be a color conversion layer (blue) for converting light of a near-ultraviolet region to a blue region into blue light. The color conversion layer (blue) can convert the light emission from the light emitting element into a blue color with high color purity. In this case, it is required that the light emission from the light emitting element be light emission containing a spectral component with a shorter wavelength than a desired blue color.

It is to be noted that FIG. 6B corresponds to FIG. 5B while FIG. 6C corresponds to FIG. 5C respectively. Other structures and effects are similar to Embodiment Mode 6, therefore, description thereof is omitted. The description in Embodiment Mode 6 is to be referred to.

Embodiment Mode 9

FIG. 7A shows a structure of a light emitting device of the invention as an example. FIG. 7A shows a portion of a cross sectional view of a pixel portion of a passive matrix light emitting device with a reverse tapered structure. The light emitting device of the invention shown in FIG. 7A includes a substrate 300, a first electrode 301 of a light emitting element, a first partition 302, a second partition 303, a layer 304 containing an organic compound, a second electrode 305 of a light emitting element, a color conversion layer (green) 306, a color conversion layer (red) 307, and a counter substrate 308. The second partition 303 has a reverse tapered shape in which outer edges of a top portion are projected outside those of a bottom portion. It is to be noted in FIG. 7A that a sealing material is not shown.

A light emitting element is formed in a portion where the layer 304 containing an organic compound is sandwiched by the first electrode 301 and the second electrode 305 of the light emitting element. The first electrode 301 and the second electrode 305 cross each other and are formed in stripe where light emitting elements are formed at intersection portions. The first partition 302 and the second partition 303 are formed in parallel to the second electrode 305, thereby the light emitting element is insulated by the first partition 302 and the second partition 303 from another light emitting element having the first electrode 301 in common. With the second partition 303 having a reverse tapered shape, the layer 304 containing an organic compound and the second electrode 305 can be formed in a self-aligned manner.

In this embodiment mode, the first electrode 301 functions as a reflective electrode formed of a highly reflective material (reflectivity of light emitted from the light emitting layer is 70% or more) while the second electrode 305 functions as a transparent electrode formed of a light-transmissive conductive material. For specific materials of these, Embodiment Mode 1 may be referred to.

The substrate 300, the partitions (the first partition 302 and the second partition 303), the layer 304 containing an organic compound, the color conversion layer (green) 306, the color conversion layer (red) 307, and the counter substrate 308 in FIG. 7A correspond to the substrate 100, the partition 108, the layer 109 containing an organic compound, the color conversion layer (green) 111, the color conversion layer (red) 112, and the counter substrate 133 in FIG. 1A respectively. The structures and effects of these are similar to those of Embodiment Mode 1; therefore, description thereof is omitted. The description in Embodiment Mode 1 is to be referred to.

Embodiment Mode 10

In this embodiment mode, a comparable structure to Embodiment Mode 9 is described with reference to FIG. 7B. A light emitting device of the invention shown in FIG. 7B includes a substrate 350, a first electrode 351 of a light emitting element, a first partition 352, a second partition 353, a layer 354 containing an organic compound, a second electrode 355 of the light emitting element, a color conversion layer (green) 356, a color conversion layer (red) 357, and a counter substrate 358. The second partition 353 has a reverse tapered shape where outer edges of a top portion are outside a bottom portion. It is to be noted in FIG. 7B that a sealing material is omitted. In this embodiment mode, a bottom emission type light emitting device in which the light emitting element emits light to the first electrode 351 side is shown as an example. In this embodiment mode, the first electrode 351 is formed of a light-transmissive conductive material in order to extract light from the first electrode 351 side while the second electrode 355 is formed of a highly reflective conductive material (reflectivity of light emitted from the light emitting layer is 70% or more) as a reflective electrode. For specific materials of these, Embodiment Mode 1 may be referred to.

The layer 354 containing an organic compound has a stacked-layer structure as shown in FIG. 2B. It is to be noted that the first electrode 450 in FIG. 2B corresponds to the first electrode 351 in FIG. 7B while the second electrode 453 in FIG. 2B corresponds to the second electrode 355 in FIG. 7B. Moreover, a stack of the buffer layer 401 and the light emitting layer 402 in FIG. 2B correspond to the layer 354 containing an organic compound in FIG. 7B. That is, the layer 354 containing an organic compound is formed of a stack of the buffer layer 401 and the light emitting layer 402. The buffer layer 401 is provided on the second electrode 355 side which is a reflective electrode.

In this embodiment mode, light is emitted to the first electrode 351 side, that is the substrate 350 side, therefore, a color conversion layer is not provided for the counter substrate 358, and a color conversion layer (green) 356 and a color conversion layer (red) 357 are formed over the substrate 350. In the case where depressions and projections caused by providing the color conversion layers over the substrate 350 adversely affect the following manufacture of elements, it is preferable to provide a depression/projection smoothing layer 359 which is formed of a material having a self-planarizing property such as acrylic, polyimide, and siloxane.

The substrate 350, the partitions (the first partition 352 and the second partition 353), the layer 354 containing an organic compound, the color conversion layer (green) 356, the color conversion layer (red) 357, the counter substrate 358, and the depression/projection smoothing layer 359 in FIG. 7B correspond to the substrate, 150, the partition 158, the layer 159 containing an organic compound, the color conversion layer (green) 161, the color conversion layer (red) 162, the counter substrate 163, and the depression/projection layer 164 in FIG. 1B respectively. The structures and effects of these are similar to Embodiment Mode 2, therefore, description thereof is omitted. The description in Embodiment Mode 2 is to be referred to.

Embodiment Mode 11

Figure 8A:
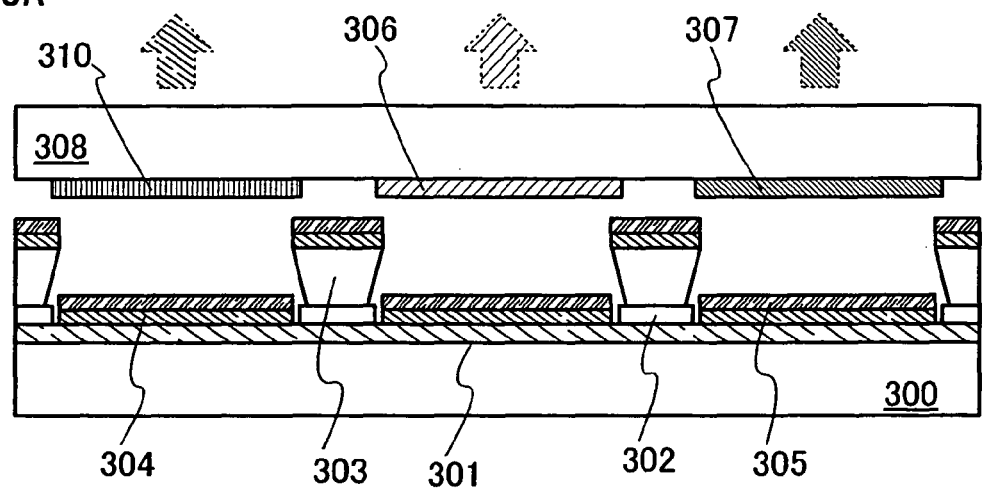
FIGS. 8A and 8B are cross sectional schematic views of a light emitting device of the invention.

FIG. 8A is a view showing a light emitting device of the invention with a comparable structure to Embodiment Mode 9. The structure of this embodiment mode is almost the same as the structure described in Embodiment Mode 9 (see FIG. 7A), besides a blue color filter 310 is provided. When light is emitted from a light emitting layer through a blue color filter 310, color purity can be improved. This is a favorable structure with relatively less loss of light since the light emitted from the light emitting element has a wavelength in a region near a blue color. It is also a favorable structure that the light emitted from the light emitting element is adjusted to the absorption of the color conversion layer (green) 306 and the color conversion layer (red) 307 and color purity of blue color is improved with a color filter. It is to be noted in FIG. 8A that a sealing material is not shown.

The color filter 310 may be a color conversion layer (blue) for converting light of a near-ultraviolet region to a blue region into blue light. The color conversion layer (blue) can convert the light emission from the light emitting element into a blue color with high color purity. In this case, it is required that the light emission from the light emitting element be light emission containing a spectral component with a shorter wavelength than a desired blue color.

Other structures and effects are similar to Embodiment Mode 9, therefore, description thereof is omitted. The description in Embodiment Mode 9 is to be referred to.

Embodiment Mode 12

Figure 8B:
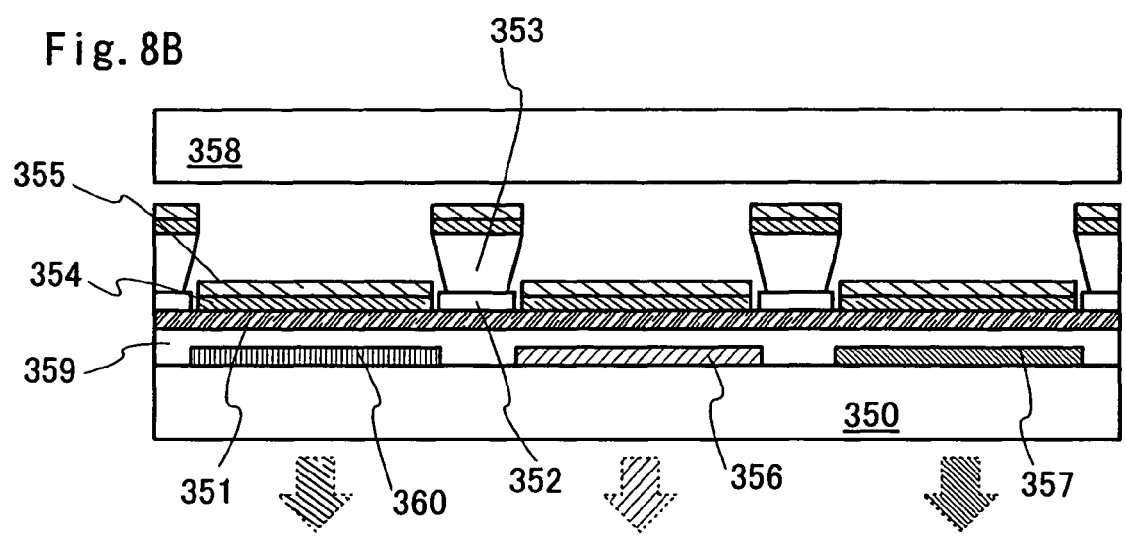

FIG. 8B is a view showing a light emitting device of the invention with a comparable structure to Embodiment Mode 10. The structure of this embodiment mode is almost the same as the structure described in Embodiment Mode 10 (see FIG. 7B), besides a blue color filter 360 is provided. When light is emitted from a light emitting layer through a blue color filter 360, color purity can be improved. This is a favorable structure with relatively less loss of light since the light emitted from the light emitting element has a wavelength in a region near a blue color. It is also a favorable structure that the light emitted from the light emitting element is adjusted to the absorption of the color conversion layer (green) 356 and the color conversion layer (red) 357 and color purity of blue color is improved with a color filter. It is to be noted in FIG. 8B that a sealing material is not shown.

The color filter 360 may be a color conversion layer (blue) for converting light of a near-ultraviolet region to a blue region into blue light. The color conversion layer (blue) can convert the light emission from the light emitting element into a blue color with high color purity. In this case, it is required that the light emission from the light emitting element be light emission containing a spectral component with a shorter wavelength than a desired blue color.

Other structures and effects are similar to Embodiment Mode 10, therefore, description thereof is omitted. The description in Embodiment Mode 10 is to be referred to.

Embodiment Mode 13

Figure 9A:
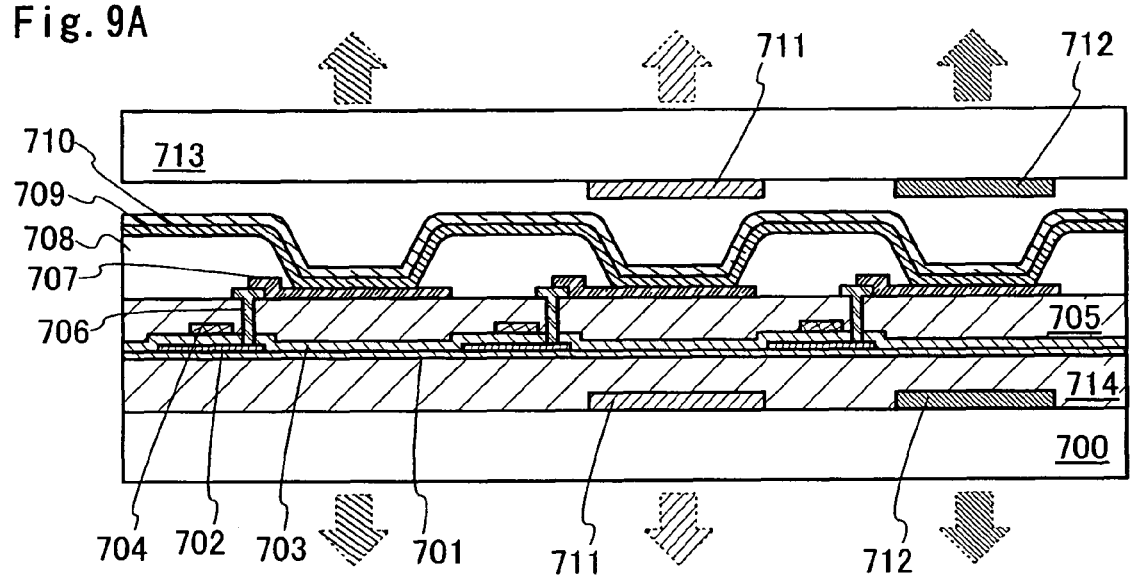
FIGS. 9A and 9B are cross sectional schematic views of a light emitting device and a light emitting element of the invention respectively.
Figure 9B:
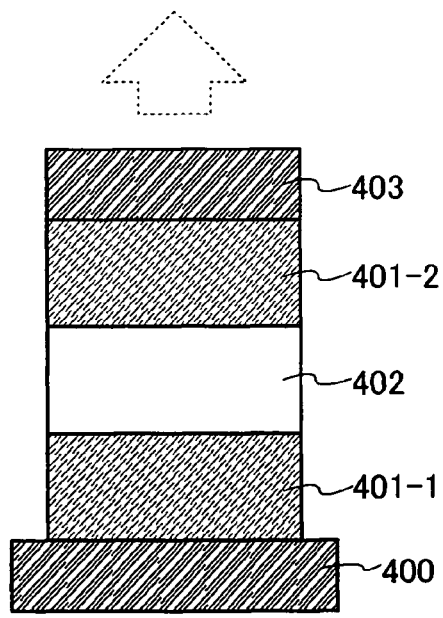

In this embodiment mode, another embodiment mode of the invention is described with reference to FIGS. 9A and 9B. A light emitting device of this embodiment mode shown in FIG. 9A includes a substrate 700, a base film 701, a semiconductor film 702, a gate insulating film 703, a gate electrode 704, an interlayer insulating film 705, a connecting portion 706, a first electrode 707 of a light emitting element 707, a partition 708, a layer 709 containing an organic compound, a second electrode 710 of the light emitting element, a color conversion layer (green) 711, a color conversion layer (red) 712, a counter substrate 713, and a depression/projection smoothing layer 714. Light emission is extracted from both sides of the substrate 700 and the counter substrate 713. It is to be noted in FIG. 9A that a sealing material is omitted. As light is extracted from both sides, color conversion layers are provided on both sides of the substrate 700 and the counter substrate 713. The first electrode 707 and the second electrode 710 are both formed of a light-transmissive conductive material. In this embodiment mode, a reflective electrode is not provided, however, some difference in refractive index is generated between the layer 709 containing an organic compound and a light-transmissive conductive material, which causes some reflection. By utilizing this reflection light, color purity and light emission efficiency can be improved. The layer 709 containing an organic compound has a structure where a buffer layer 401-1 and a buffer layer 401-2 are provided on both sides of the light emitting layer 402. The thicknesses of the buffer layer 401-1 and the buffer layer 401-2 are set similarly to Embodiment Mode 1. Moreover, it is preferable that the buffer layer provided on the side of the electrode which functions as the cathode have a two-layer structure with a layer which generates electrons. Details thereof are similar to Embodiment Mode 1. Other structures and effects are also similar to Embodiment Mode 1, therefore, description thereof is omitted. The description in Embodiment Mode 1 is to be referred to. It is to be noted that the factors of this embodiment mode can be used in combination with other appropriate embodiment modes.

Embodiment Mode 14

In this embodiment mode, another embodiment mode of the invention is described. A color conversion layer emits light by absorbing light. Therefore, when external light comes in, the color conversion layer emits light, thereby the contrast is deteriorated. In such a case, the contrast is improved by providing a color filter which passes through light having a wavelength adjusted to the light emitted from the color conversion layer, between the color conversion layer and the substrate or the counter substrate. Further, the color purity can also be improved by providing a color filter. This embodiment mode can be implemented in combination with other appropriate embodiment modes.

Embodiment Mode 15

In this embodiment mode, a manufacturing method of a light emitting device of the invention is described with reference to FIGS. 10A to 12. It is to be noted that an active matrix light emitting device which emits light to a counter substrate side, which corresponds to the light emitting device described in Embodiment Mode 1, is manufactured as an example in this embodiment mode.

Figure 10A:
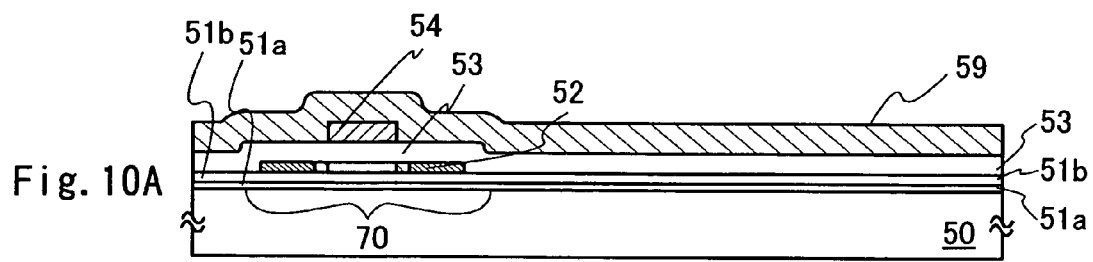
FIGS. 10A to 10E are cross sectional schematic views of a manufacturing method of a light emitting device of the invention.
Figure 10B:
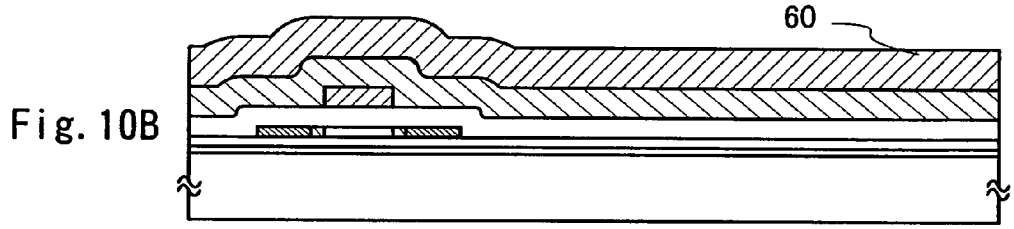
Figure 10C:
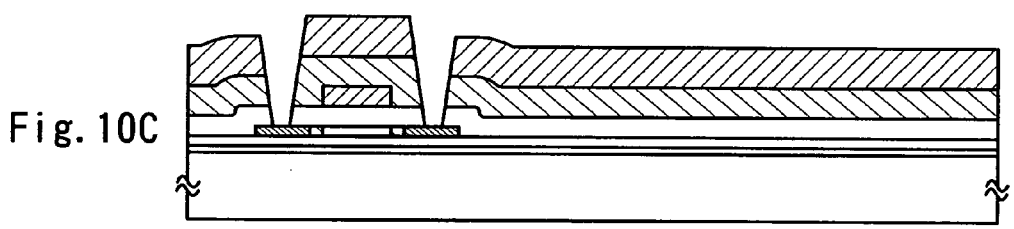
Figure 10D:
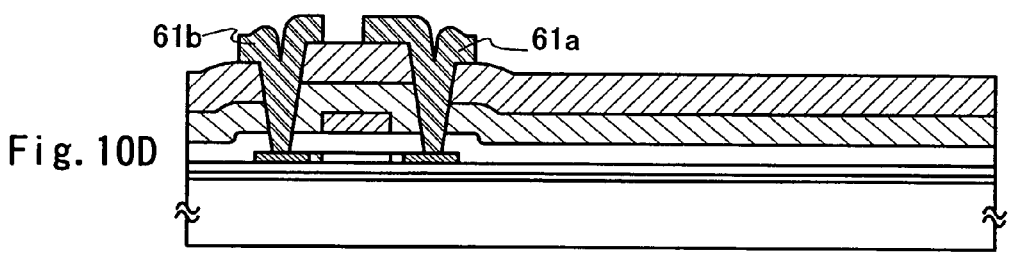
Figure 10E:
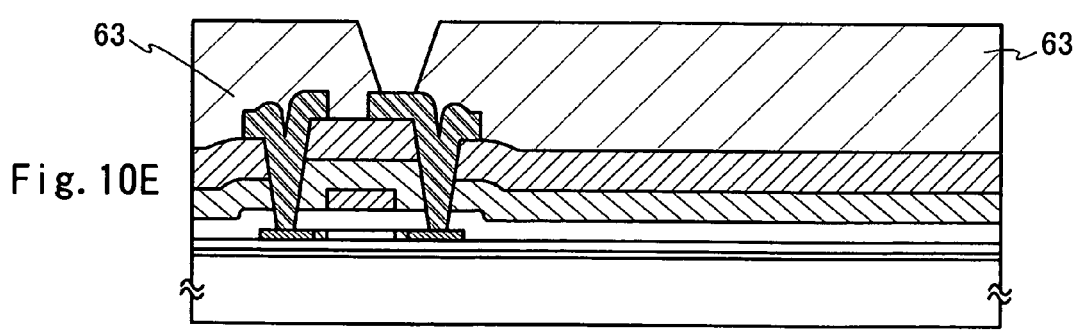

First, a first base insulating layer 51*a* and a second base insulating layer 51*b* are formed over a substrate 50, and then a semiconductor layer is formed over the second base insulating layer 51*b* (see FIG. 10A).

The substrate 50 may be a substrate formed of glass, quartz, plastic (polyimide, acrylic, polyethylene terephthalate, polycarbonate, polyacrylate, polyether sulfone, and the like) and the like. These substrates may be polished by CMP or the like before use as required. In this embodiment mode, a glass substrate is used.

The first base insulating layer 51*a* and the second base insulating layer 51*b* are provided to prevent elements which adversely affect the characteristics of the semiconductor film, such as alkali metal or alkaline earth metal from dispersing into the semiconductor layer. As a material for the first base insulating layer 51*a* and the second base insulating layer 51*b*, silicon oxide, silicon nitride, silicon oxide containing nitrogen, silicon nitride containing oxygen, and the like can be used. In this embodiment mode, the first base insulating layer 51*a* is formed of silicon nitride while the second base insulating layer 51*b* is formed of silicon oxide. In this embodiment mode, the base insulating layer is formed of two layers of the first base insulating layer 51*a* and the second base insulating layer 51*b*, however, it may be formed of a single layer or multiple layers of two or more layers. Moreover, the base insulating layer is not required to be formed when dispersion of impurities from the substrate is not a problem.

The base insulating layer may be formed by processing the surface of the substrate 50 with high density plasma. The high density plasma is, for example, generated by using a microwave with a high frequency of 2.45 GHz. It is to be noted that high density plasma with an electron density of $10^{11}$ to $10^{13}$ cm$^{-3}$ and an electron temperature of 2 eV or lower, and an ion energy of 5 eV or lower is used. In this manner, high density plasma has low kinetic energy of active species, therefore, a film with less plasma damage and defect can be formed. The antenna which generates a microwave and the substrate 50 are placed at a distance of 20 to 80 mm, preferably 20 to 60 mm.

By performing the high density plasma treatment in an atmosphere containing nitrogen and rare gas, an atmosphere containing nitrogen, hydrogen, and rare gas, or an atmosphere containing ammonium and rare gas, the surface of the substrate 50 can be nitrided. In the case of using a glass substrate, a quartz substrate, a silicon wafer, or the like as the substrate 50, the substrate 50 can be used as the first base insulating layer 51*a* by applying nitridation treatment by the high density plasma, because the nitride film formed over the surface of the substrate 50 contains silicon nitride as a main component. Silicon oxide or silicon oxynitride may be formed by a plasma CVD method over the nitride layer to form the second base insulating layer 51*b*.

By applying nitridation treatment by similar high density plasma over the surface of the base insulating layer formed of silicon oxide, silicon oxynitride, or the like, a nitride film can be formed over the surface thereof. This nitride film is favorable since it can suppress the dispersion of impurities from the substrate 50 and can be formed quite thin. Therefore, there is little effect of stress to the semiconductor layer formed thereover.

A subsequently formed semiconductor layer is obtained by crystallizing an amorphous silicon film by laser in this embodiment mode. An amorphous silicon film is formed over the second base insulating layer 51*b* with a thickness of 25 to 100 nm (preferably 30 to 60 nm). The amorphous silicon film can be formed by a known method such as a sputtering method, a low pressure CVD method, or a plasma CVD method. After that, thermal treatment is performed at 500° C. for one hour to perform dehydrogenation.

Subsequently, an amorphous silicon film is crystallized by a laser irradiation apparatus to form a crystalline silicon film. In this embodiment mode, an excimer laser is used for laser crystallization. An oscillated laser beam is processed into a linear beam spot by using an optical system and used for irradiation to form the crystalline silicon film. Thus formed crystalline silicon film is used as a semiconductor layer.

In addition, the amorphous silicon film may be crystallized by only thermal treatment or thermal treatment using a catalyst element which promotes crystallization. The element which promotes crystallization is, nickel, iron, palladium, tin, lead, cobalt, platinum, copper, gold, and the like can be used. By using such elements, crystallization can be performed at a lower temperature for shorter time as compared to crystallization performed only by thermal treatment, therefore, a glass substrate or the like receives less damage. In the case of crystallization only by thermal treatment, a quartz substrate or the like which is resistant to heat is preferably used.

Subsequently, a slight amount of impurities are added to the semiconductor layer to control a threshold value as required, that is channel doping is performed. In order to obtain a desired threshold value, impurities which impart n-type or p-type conductivity (phosphorus, boron, or the like) are added by an ion doping method or the like.

After that, the semiconductor layer is processed into a desired shape as shown in FIG. 10A to obtain an island-shaped semiconductor layer 52. This process is performed by applying a photo resist over the semiconductor layer, exposing a predetermined mask shape, baking, forming a resist mask over the semiconductor layer, and etching the layer by using this mask.

Subsequently, a gate insulating film 53 is formed so as to cover the semiconductor layer 52. The gate insulating film 53 is formed of an insulating layer containing silicon with a thickness of 40 to 150 nm by a plasma CVD method or a sputtering method. In this embodiment mode, silicon oxide is used. In this case, the surface of the gate insulating film 53 may be densified by oxidization or nitridation treatment by high density plasma treatment in an oxygen atmosphere or a nitrogen atmosphere.

Prior to forming the gate insulating film 53, the surface of the semiconductor layer 52 may be oxidized or nitrided by high density plasma treatment. At this time, by performing the high density plasma treatment in an oxygen atmosphere or a nitrogen atmosphere at a temperature of 300 to 450° C., a favorable interface can be created with the gate insulating film 53 formed thereover.

Subsequently, a gate electrode 54 is formed over the gate insulating film 53. The gate electrode 54 may be formed of an element selected from tantalum, tungsten, titanium, molybdenum, aluminum, copper, chromium, and niobium, or an alloy material or a compound material containing the aforementioned element as a main component. Further, a semiconductor film typified by a polycrystalline silicon film to which impurity elements such as phosphorus are doped may also be used. Alternatively, AgPdCu alloy may be used.

In this embodiment mode, the gate electrode 54 is formed of a single layer, however, it may have a stacked-layer structure of two or more layers having a lower layer formed of tungsten and an upper layer formed of molybdenum. In the case where the gate electrode has a stacked-layer structure, the materials described in the former paragraph may also be used. Further, the combination thereof may be appropriately selected. The gate electrode 54 is processed by etching using a mask of photo resist.

Subsequently, high concentration impurities are added to the semiconductor layer 52 with the gate electrode 54 as a mask. As a result, a thin film transistor 70 including the semiconductor layer 52, the gate insulating film 53, and the gate electrode 54 is formed.

It is to be noted that manufacturing steps of the thin film transistor are not particularly limited and may be changed appropriately so that a transistor having a desired structure can be manufactured.

In this embodiment mode, a top gate type thin film transistor formed of a crystalline silicon film crystallized by laser is used; however, a bottom gate type thin film transistor formed of an amorphous semiconductor film can be used for a pixel portion as well. An amorphous semiconductor may be formed not only of silicon but also SiGe. In the case of using SiGe, it is preferable that germanium be contained at a concentration of about 0.01 to 4.5 atomic %.

Moreover, a micro crystalline semiconductor film (semi-amorphous semiconductor) which is an amorphous semiconductor in which crystal grains having a size of 0.5 to 20 nm are observed may also be used. A micro crystal in which crystal grains having a size of 0.5 to 20 nm are observed is also called a microcrystal (μc).

Semi-amorphous silicon (also referred to as SAS), which is a semi-amorphous semiconductor, can be obtained by glow discharge decomposition of gas containing silicon. The gas containing silicon is typically $SiH_4$, and in addition, $Si_2H_6$, $SiH_2Cl_2$, $SiHCl_3$, $SiCl_4$, $SiF_4$, and the like can be used. SAS can be formed easily by diluting the gas containing silicon by hydrogen or hydrogen and one or a plurality of kinds of rare gas elements selected from helium, argon, krypton, and neon. The dilution ration is preferably 10 to 1000 times. The generation of a film by reaction of the glow discharge decomposition may be performed at a pressure of 0.1 to 133 Pa. The power frequency is set to be 1 to 120 MHz, and preferably, 13 to 60 MHz. The substrate heating temperature may be set at 300° C. or lower, and more preferably, 100 to 250° C.

Raman spectrum of SAS formed in this manner is shifted toward lower wave numbers than 520 $cm^{-1}$. The diffraction peaks of (111) and (220), which are believed to be derived from Si crystal lattice, are observed in the SAS by the X-ray diffraction. The SAS contains hydrogen or halogen of at least 1 atomic % or more to terminate dangling bonds. With respect to impurity elements contained in the film, each concentration of impurities for atmospheric constituents such as oxygen, nitrogen and carbon is preferably set to be $1\times10^{20}/cm^3$ or lower. In particular, the oxygen concentration is set to be $5\times10^{19}/cm^3$ or lower, and preferably, $1\times10^{19}/cm^3$ or lower. The field effect mobility μ as a TFT is 1 to 10 $cm^2/Vsec$.

Moreover, the SAS may be further crystallized by laser to be used.

Subsequently, an insulating film (a hydrogenated film) 59 is formed by using silicon nitride so as to cover the gate electrode 54 and the gate insulating film 53. The insulating film (hydrogenated film) 59 is heated at 480° C. for one hour to activate the impurity element and hydrogenate the semiconductor layer 52. After forming the insulating film (hydrogenated film) 59, high density plasma treatment may be performed by introducing hydrogen gas. As a result, the layer can be densified. Moreover, the semiconductor layer 52 can be hydrogenated by discharging hydrogen by subsequently performing thermal treatment at 400 to 450° C.

Subsequently, a first interlayer insulating layer 60 is formed so as to cover the insulating film (hydrogenated film) 59. As a material for forming the first interlayer insulating layer 60, silicon oxide, acrylic, polyimide, siloxane, a low dielectric material, or the like may be used. In this embodiment mode, the first interlayer insulating layer is formed of a silicon oxide film (see FIG. 10B).

Subsequently, a contact hole reaching the semiconductor layer 52 is opened. The contact hole can be formed by etching so as to expose the semiconductor film 52 by using a resist mask, for which either of wet etching or dry etching can be used. It is to be noted that etching may be performed once or a plurality of times depending on the conditions. In the case of performing etching a plurality of times, both wet etching and dry etching may be performed (see FIG. 10C).

A conductive layer to cover the contact hole and the first interlayer insulating layer 60 is formed. The conductive layer is processed into a desired shape, thereby a connecting portion 61a, a wire 61b, and the like are formed. This wire may be a single layer of aluminum, copper, alloy of aluminum, carbon, and nickel, alloy of aluminum, carbon, and molybdenum, or the like, however, a stacked-layer structure of molybdenum, aluminum, and molybdenum, a stacked-layer structure of titanium, aluminum, and titanium, or a stacked-layer structure of titanium, titanium nitride, aluminum, and titanium from the substrate side may also be employed (see FIG. 10D).

After that, a second interlayer insulating layer 63 is formed so as to cover the connecting portion 61a, the wire 61b, and the first interlayer insulating layer 60. A coating film formed of acrylic, polyimide, siloxane, or the like having a self-planarizing property is preferably used as a material for forming the second interlayer insulating layer 63. In this embodiment mode, siloxane is used for forming the second interlayer insulating layer 63 (see FIG. 1E).

Next, an insulating layer may be formed of silicon nitride or the like over the second interlayer insulating layer 63. This layer is formed to prevent overetching the second interlayer insulating layer 63 when etching a pixel electrode later. Therefore, this layer is not required to be formed when an etching rate of the pixel electrode and the second interlayer insulating layer is large. Next, a contact hole which passes through the second interlayer insulating layer 63 and reaches the connecting portion 61a is formed.

After forming a light-transmissive conductive layer so as to cover the contact hole and the second interlayer insulating layer 63 (or the insulating layer), the light-transmissive conductive layer is processed to form a first electrode 64 of a thin film light emitting element. Here, the first electrode 64 is electrically in contact with the connecting portion 61a.

The first electrode 64 can be formed of a conductive film as shown in Embodiment Mode 1 using a material of a conductive metal such as aluminum (Al), silver (Ag), gold (Au), platinum (Pt), nickel (Ni), tungsten (W), chromium (Cr), molybdenum (Mo), iron (Fe), cobalt (Co), copper (Cu), palladium (Pd), lithium (Li), cesium (Cs), magnesium (Mg), calcium (Ca), strontium (Sr), or titanium (Ti); an alloy thereof such as aluminum—Si (Al—Si), aluminum—titanium (Al—Ti), or aluminum—silicon—copper (Al—Si—Cu); a nitride of a metal material such as titanium nitride (TiN), a metal compound such as ITO (indium tin oxide), ITO containing silicon, IZO (indium zinc oxide) in which 2 to 20 wt % of zinc oxide (ZnO) is mixed with indium oxide, or the like.

Figure 11A:
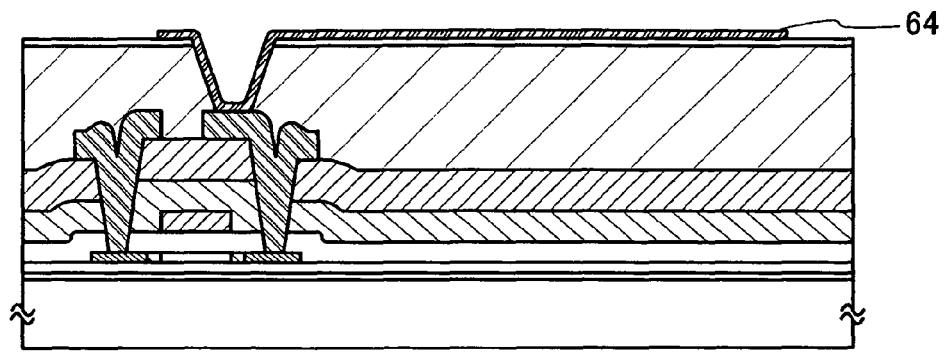
FIGS. 11A to 11C are cross sectional schematic views of a manufacturing method of a light emitting device of the invention.

An electrode through which light is extracted may preferably be formed using a light-transmissive conductive film. For example, a metal compound such as ITO (indium tin oxide), ITO containing silicon (ITSO), or IZO (indium zinc oxide) in which 2 to 20% of zinc oxide (ZnO) is mixed with indium oxide can be used. In addition, an extremely thin film of metal such as Al or Ag is used. Since light is extracted from a counter substrate side (a second electrode side) in this embodiment mode, a highly reflective material (e.g., Al, Ag or the like) is preferably used for the first electrode. In this embodiment mode, aluminum is used as the first electrode 64 (FIG. 11A).

Figure 19:
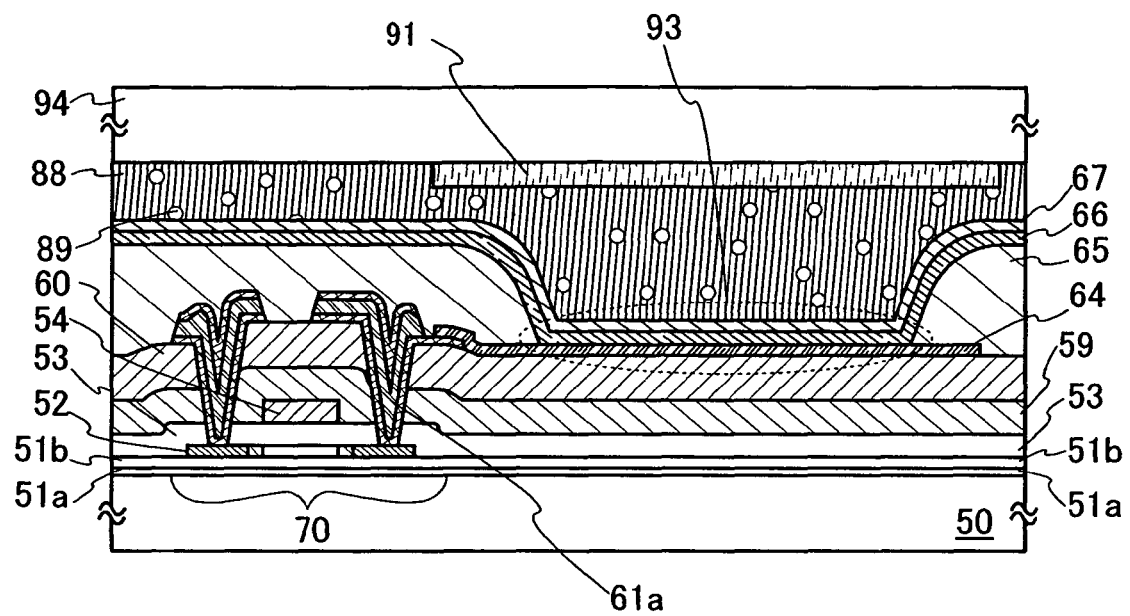
FIG. 19 is a cross sectional schematic view of a light emitting device of the invention.

In this embodiment mode, the connecting portion 61a and the wire 61b of the thin film transistor and the first electrode 64 are formed over different insulating layers as an example, however, the connecting portion 61a (the connecting portion 106 in Embodiment Mode 1) and the first electrode 64 (the first electrode 107 in Embodiment Mode 1) may be formed over the same insulating film as shown in FIG. 19 of Embodiment Mode 1. Moreover, the connecting portion 61a and the first electrode 64 may contact as shown in FIG. 19. That is, the connecting portion 61a is formed of stacked layers of titanium, aluminum, titanium, and the like and a portion thereof on the first electrode 64 side is processed so that the undermost layer of titanium is exposed. Then, the undermost layer of titanium which is exposed and the first electrode 64 get contact.

Figure 11B:
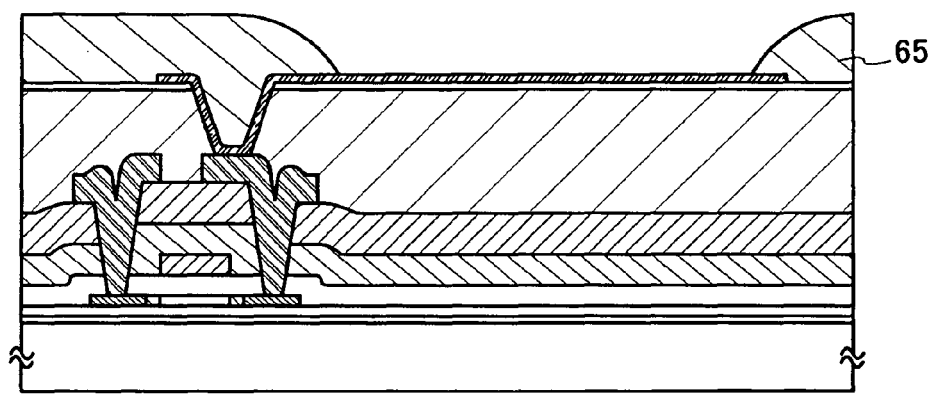
Figure 11C:
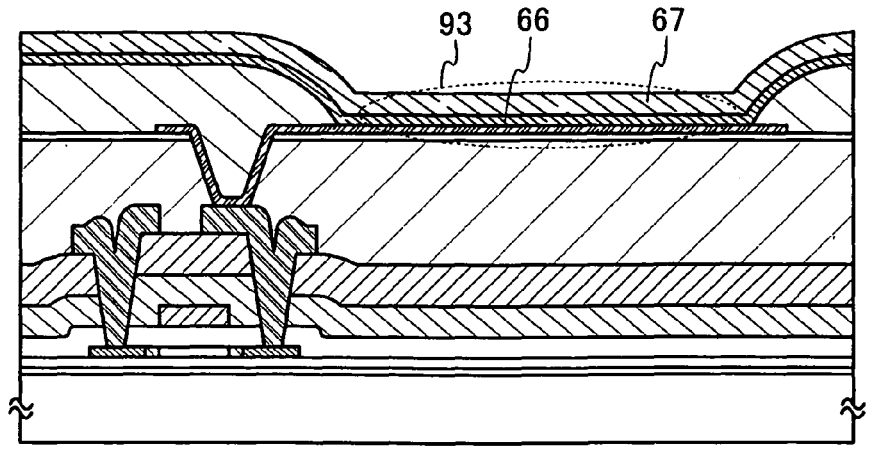
Figure 12:
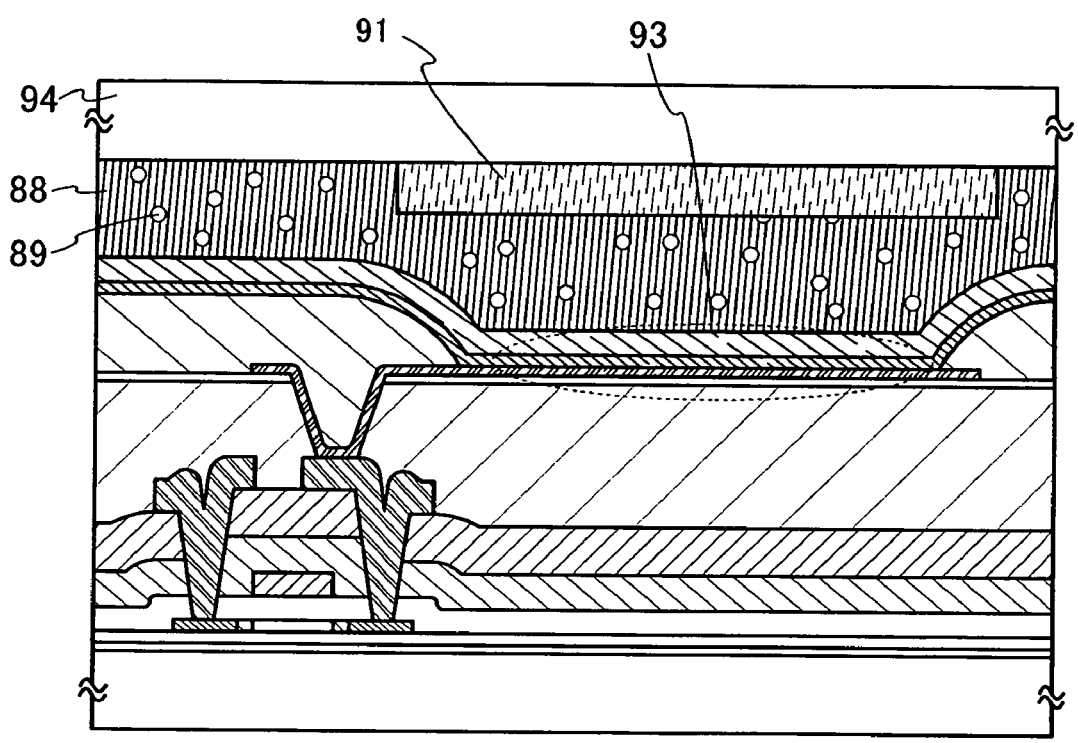
FIG. 12 is a cross sectional schematic view of a manufacturing method of a light emitting device of the invention.

Next, an insulating layer is formed of an organic material or an inorganic material so as to cover the second interlayer insulating layer 63 (or the insulating layer) and the first electrode 64. Subsequently, the insulating layer is processed so as to partially expose the first electrode 64, thereby forming a partition 65. As the material of the partition 65, a photosensitive organic material (such as acrylic or polyimide) is preferable. Alternatively, a non-photosensitive organic or inorganic material may also be used. Further, the partition 65 may be used as a black matrix by making the partition 65 black in such a way that a black pigment or dye such as titanium black or carbon nitride is diffused into the material of the partition 65 using a dispersant or the like. It is desirable that the partition 65 have a tapered shape in its end surface toward the first electrode with its curvature changing continuously (FIG. 11B).

Next, a layer 66 containing an organic compound is formed, and a second electrode 67 covering the layer 66 containing an organic compound is formed subsequently. Thus, a light emitting element 93 in which the layer 66 containing a light emitting substance is sandwiched between the first electrode 64 and the second electrode 67 can be formed. For the second electrode 67 in a light emitting device in which light is emitted to the counter substrate side, a light-transmissive conductive material is used. ITSO is used for the second electrode 67 in this embodiment mode.

The layer 66 containing an organic compound is formed of a buffer layer and a light emitting layer as described in Embodiment Mode 1. The buffer layer is formed on the first electrode 64 side which is a reflective electrode. The buffer layer may be formed by co-evaporation of an inorganic material and an organic material, a wet processing method typified by a sol-gel method, or other methods. The light emitting layer may be formed by an evaporation method, an ink-jet method, a spin coating method, a dip coating method, or the like. As described in Embodiment Mode 1, the light emitting layer may be formed of stacked layers having various functions or a single layer of the light emitting layer. Moreover, the layer containing a light emitting substance is formed so that light emission of a near-infrared region to a blue-green region is obtained by using the materials described in Embodiment Mode 1.

After that, a silicon oxide film containing nitrogen is formed as a passivation film by a plasma CVD method. In the case of using the silicon oxide film containing nitrogen, a silicon oxynitride film formed using $SiH_4$, $N_2O$, and $NH_3$ by a plasma CVD method, a silicon oxynitride film formed using $SiH_4$ and $N_2O$ by a plasma CVD method, or a silicon oxynitride film formed using a gas in which $SiH_4$ and $N_2O$ are diluted with Ar by a plasma CVD method is preferably formed.

As the passivation film, a silicon oxynitride hydride film formed using $SiH_4$, $N_2O$, and $H_2$ is also applicable. Needless to say, the structure of the first passivation film is not limited to a single-layer structure, and the first passivation film may be formed in a single-layer structure or a stacked-layer structure including another insulating layer containing silicon. A multi-layer film of a carbon nitride film and a silicon nitride film, a multi-layer film including styrene polymer, a silicon nitride film, or a diamond-like carbon film may be formed instead of a silicon oxide film containing nitrogen.

Subsequently, in order to protect the light emitting element from a deterioration-promoting substance such as moisture, the display portion is sealed. In the case of using a counter substrate for the sealing, the counter substrate and an element substrate are attached together with an insulating sealing material (not shown) so as to expose an external connection portion. The space between the counter substrate and the element substrate may be filled with an inert gas such as dry nitrogen, or the whole surface of the pixel area may be coated with the sealing material for attaching the counter substrate. It is preferable to use an ultraviolet curable resin or the like for the sealing material. A drying agent or particles for keeping the gap between the substrates uniform may be mixed in the sealing material. Subsequently, a flexible wiring substrate is attached to the external connection portion, thereby completing a light emitting device (see FIG. 12). In this embodiment mode, resin 88 or the like having light transmissivity is filled between a counter substrate 94 and the elements and sealed. As a result, the light emitting element 93 can be prevented from deteriorating due to moisture. Moreover, the resin 88 preferably has a moisture absorbing property. Further, it is further preferable to disperse a drying agent 89 having a high light transmissivity in the resin 88, since an effect of moisture can be further suppressed.

A color conversion layer 91 is provided for the counter substrate 94. With the color conversion layer 91, light emitted from the light emitting element 93 can be converted into a desired color. It is to be noted that the color conversion layer 91 is not required to be provided when blue light emission is required.

Either an analog video signal or a digital video signal may be used in the light emitting device having a display function. The digital video signal includes a video signal using voltage and a video signal using current. When the light emitting element emits light, the video signal inputted to a pixel uses a constant voltage or a constant current. When the video signal uses a constant voltage, the voltage applied to the light emitting element or the current flowing in the light emitting element is constant. Meanwhile, when the video signal uses a constant current, the voltage applied to the light emitting element or the current flowing in the light emitting element is constant. The light emitting element to which the constant voltage is applied is driven by constant voltage driving, and the light emitting element in which the constant current flows is driven by the constant current driving. A constant current flows in the light emitting element driven by the constant current without being affected by the change in the resistance of the light emitting element. Any one of the driving methods described above can be used for a light emitting device and the driving method thereof according to the invention.

A light emitting device of the invention with the aforementioned structure can operate with high light emission efficiency and color purity, and a low driving voltage by controlling an optical path length of light in the light emitting element since a driving voltage does not drastically increase even when the buffer layer is formed thick.

One of the big problems of a light emitting device which uses a light emitting element including a pair of electrodes which sandwich a layer containing an organic compound is a life of a light emitting element, that is reliability of a long use. With high light emission efficiency, the same luminance can be obtained with a small current density as compared to a light emitting device with low light emission efficiency. Therefore, the life of the light emitting device can be longer and the reliability of a long use can be improved. In addition, a driving voltage is a very important factor for a light emitting device of which application for mobile devices is expected in particular. As described above, a light emitting device of the invention with high light emission efficiency and a low driving voltage has a great advantage in a mobile device application in particular.

This embodiment mode can be implemented in combination with other appropriate embodiment modes.

Embodiment Mode 16

In this embodiment mode, a method for forming a pattern is described, which can be used when manufacturing a semiconductor device of the invention.

In this embodiment mode, when a thin film transistor, a capacitor, a wire and the like used in an integrated circuit of a semiconductor device are formed, a resist pattern formed by patterning a resist with an exposure mask is used as an example.

Description is made with reference to FIGS. 20A to 20D on an exposure mask provided with a diffraction grating pattern or an auxiliary pattern which is formed of a translucent film and has a light intensity decreasing function.

Figure 20A:
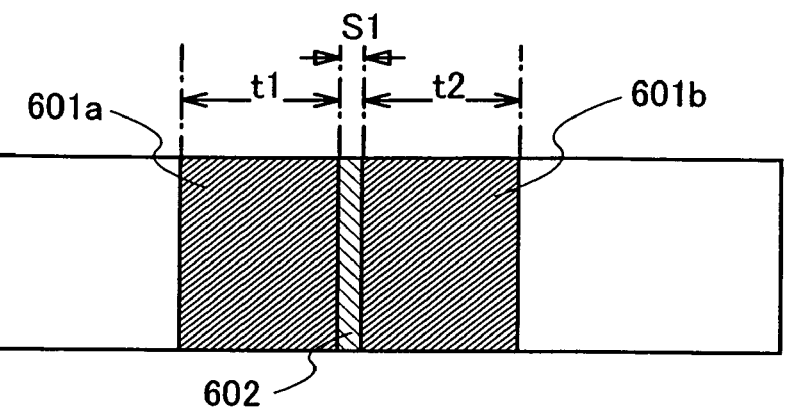
FIGS. 20A to 20D are schematic views of a manufacturing method of a resist pattern.
Figure 20B:
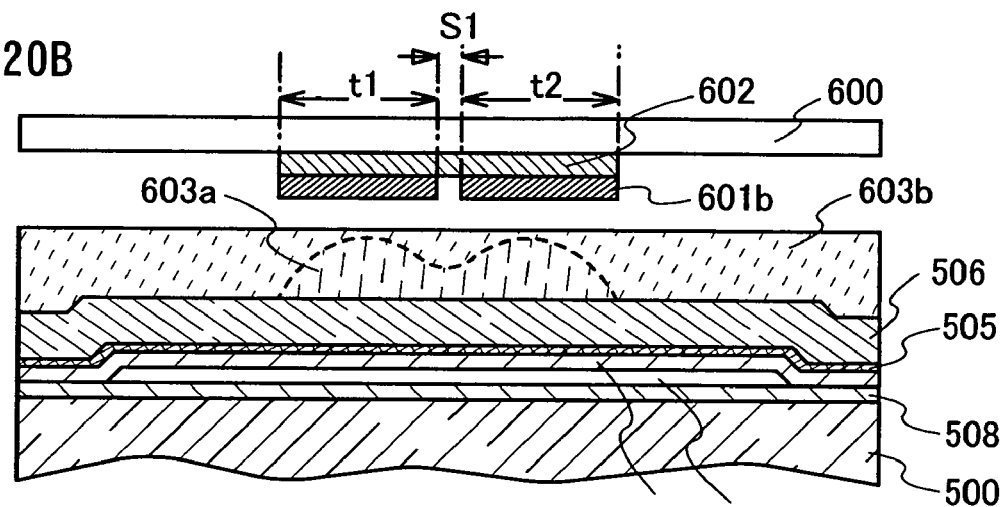

FIG. 20A is a top plan view showing an enlarged portion of the exposure mask. FIG. 20B is a cross sectional view of a portion of the exposure mask corresponding to FIG. 20A. FIG. 20B shows the exposure mask and a substrate of which entire surface is coated with resist.

In FIG. 20A, the exposure mask has light shielding portions 601a and 601b each formed of a metal film such as Cr, and a portion provided with a translucent film 602 as an auxiliary pattern. The width of the light shielding portion 601a is expressed as t1, the width of the light shielding portion 601b is expressed as t2, and the width of the portion provided with the translucent film 602 is expressed as S1. In other words, the distance between the light shielding portion 601a and the light shielding portion 601b is S1.

In FIG. 20B, the exposure mask has a light-transmissive substrate 600 provided with the translucent film 602 formed of MoSiN, and the light shielding portions 601a and 601b each formed of a metal film such as Cr so as to be stacked over the translucent film 602. In addition, the translucent film 602 can be formed of MoSi, MoSiO, MoSiON, CrSi, or the like. It is to be noted that reference numeral 500 denotes a substrate, 501 denotes a semiconductor layer, 504 denotes a gate insulating film, 505 denotes a first conductive layer, 506 denotes a second conductive layer, and 508 denotes a base insulating film.

When a resist film is exposed by using the exposure mask shown in FIGS. 20A and 20B, an unexposed region 603a and an exposed region 603b are formed. In exposure, light passes around the light shielding portions and through the translucent film, thereby the exposed region 603b shown in FIG. 20B is formed.

By development, the exposed region 603b is removed and a resist pattern formed of the unexposed region 603a shown by a dotted line is obtained.

Figure 20C:
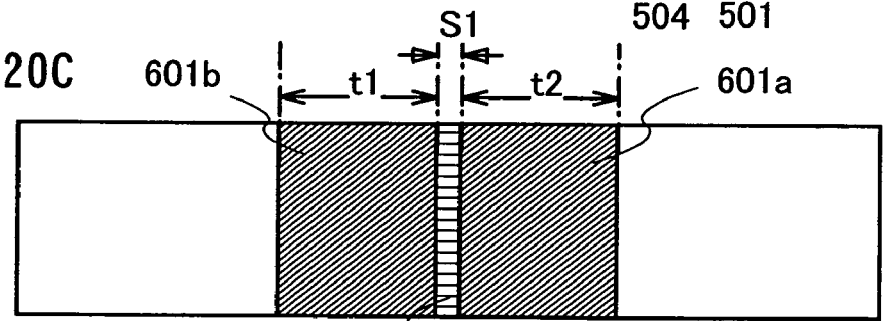

Moreover, as another example of an exposure mask, FIG. 20C shows a top plan view of an exposure mask provided with a diffraction grating pattern 612 having a plurality of slits between the light shielding portions 601a and 601b. A resist pattern formed of the unexposed region 603a can be obtained by using the exposure mask shown in FIG. 20C as well.

Figure 20D:
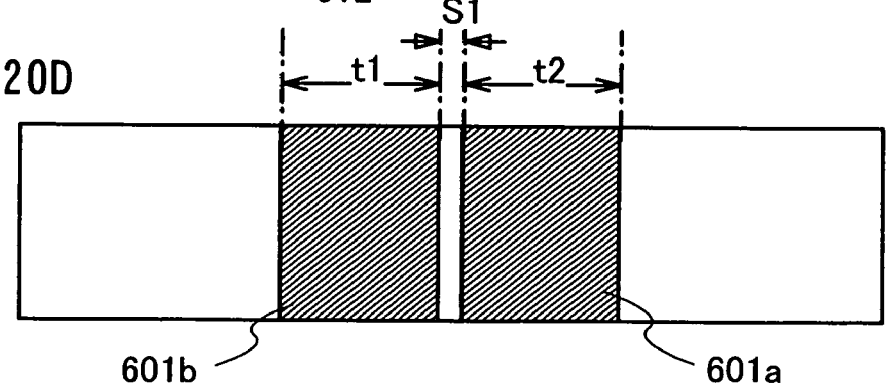

As another example of an exposure mask, FIG. 20D shows a top plan view of an exposure mask where the light shielding portions 601a and 601b are provided with a distance equal to or narrower than exposure limit. For example, exposure is performed with optimum exposure conditions using an exposure mask with to of 6 µm, t2 of 6 µM, and S1 of 1 µm and the manufacturing steps in Embodiment Mode 1 are carried out, and thus, a TFT having a double-gate structure with a distance of narrower than 2 µm or narrower between two channel forming regions can be manufactured. By using the exposure mask shown in FIG. 20D as well, a resist pattern formed of the unexposed region 603a can be similarly obtained.

In this manner, when a resist film is processed by the method shown in FIGS. 20A to 20D, a fine pattern can be selectively processed without increasing the number of steps, and various resist patterns can be obtained.

The connecting portion 61a shown in FIG. 19 of Embodiment Mode 15 may be manufactured by such a method.

This embodiment mode can be implemented in combination with other appropriate embodiment modes.

Embodiment Mode 17

Figure 13A:
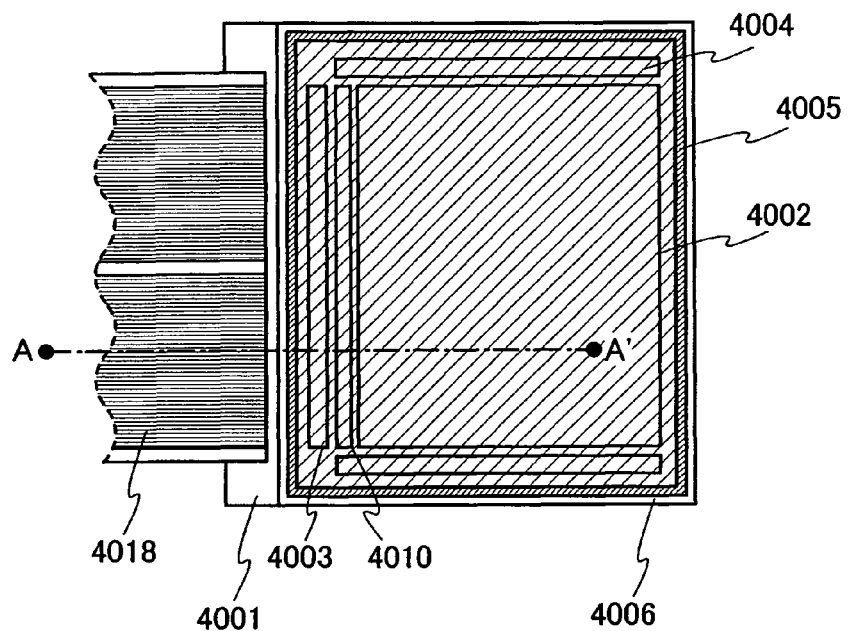
FIGS. 13A and 13B are a top schematic view and a cross sectional schematic view of a light emitting device of the invention respectively.
Figure 13B:
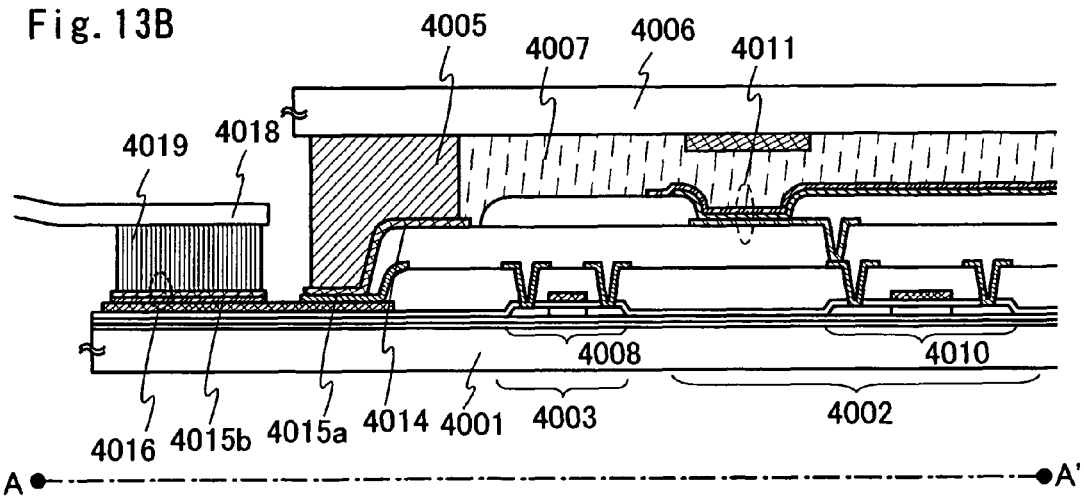

In this embodiment mode, an appearance of a panel in an active matrix light emitting device as a display device of the invention is described with reference to FIGS. 13A and 13B. FIG. 13A is a top plan view of a panel in which a transistor and a light emitting element formed over a substrate are sealed by a sealing material formed between the elements and a counter substrate 4006, while FIG. 13B is a cross sectional view of FIG. 13A. The structure of a pixel portion of this panel is similar to that described in Embodiment Mode 1.

A sealing material 4005 is provided so as to surround a pixel portion 4002, a signal line driver circuit 4003, and a scan line driver circuit 4004 provided over a substrate 4001. Moreover, the counter substrate 4006 is provided over the pixel portion 4002, the signal line driver circuit 4003, and the scan line driver circuit 4004. Therefore, the pixel portion 4002, the signal line driver circuit 4003, and the scan line driver circuit 4004 are tightly sealed with a filling material 4007 by the substrate 4001, the sealing material 4005, and the counter substrate 4006.

The pixel portion 4002, the signal line driver circuit 4003, and the scan line driver circuit 4004 provided over the substrate 4001 include a plurality of thin film transistors. In FIG. 13B, a thin film transistor 4008 included in the signal line driver circuit 4003 and a thin film transistor 4010 included in the pixel portion 4002 are shown.

A light emitting element 4011 is electrically connected to the thin film transistor 4010.

A lead wire 4014 corresponds to a wire for supplying a signal or a power source voltage to the pixel portion 4002, the signal line driver circuit 4003, and the scan line driver circuit 4004. The lead wire 4014 is connected to a connecting terminal 4016 through lead wires 4015a and 4015b. The connecting terminal 4016 is electrically connected to a terminal of a flexible printed circuit (FPC) 4018 through an anisotropic conductive film 4019.

It is to be noted that ultraviolet curable resin or thermosetting resin can be used as the filling material 4007 in addition to inert gas such as nitrogen and argon. For example, polyvinyl chloride, acrylic, polyimide, epoxy resin, silicone resin, polyvinyl butyral, or ethylene vinylene acetate can be used.

It is to be noted that a light emitting device of the invention includes a panel over which a pixel portion having a light emitting element is formed and includes a module in which an IC is incorporated in the panel.

A light emitting device of the invention with such a structure can be operated with high light emission efficiency and color purity, and a low driving voltage.

One of the big problems of a light emitting device which uses a light emitting element including a pair of electrodes which sandwich a layer containing an organic compound is a life of a light emitting element, that is reliability of a long use. With high light emission efficiency, the same luminance can be obtained with a small current density as compared to a light emitting device with low light emission efficiency. Therefore, the life of the light emitting device can be longer and the reliability of a long use can be improved. In addition, a driving voltage is a very important factor for a light emitting device of which application for mobile devices is expected in particular As described above, a light emitting device of the invention with high light emission efficiency and a low driving voltage has a great advantage in a mobile device application in particular.

This embodiment mode can be appropriately implemented in combination with other appropriate embodiment modes.

Embodiment Mode 18

In this embodiment mode, description is made on the panel, a pixel circuit and a protection circuit of the module, and operations thereof described in Embodiment Mode 17. It is to be noted that the cross sectional view shown in Embodiment Mode corresponds to a cross sectional view of the driving TFT 1403 and the light emitting element 1405.

Figure 14A:
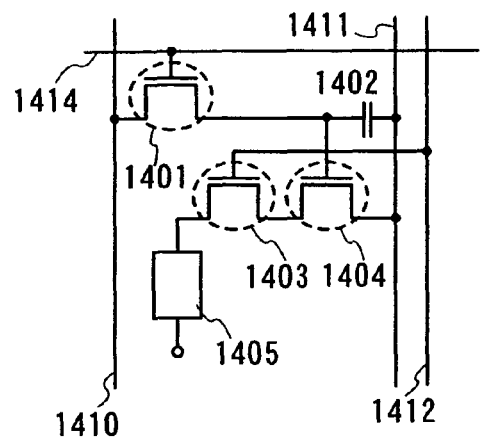
FIGS. 14A to 14F are circuit diagrams showing examples of pixel circuits.

A pixel shown in FIG. 14A includes a signal line 1410 and power source lines 1411 and 1412 in a column direction, and a scan line 1414 in a row direction. Moreover, a switching TFT 1401, a driving TFT 1403, a current controlling TFT 1404, a capacitor 1402, and a light emitting element 1405 are included.

Figure 14B:
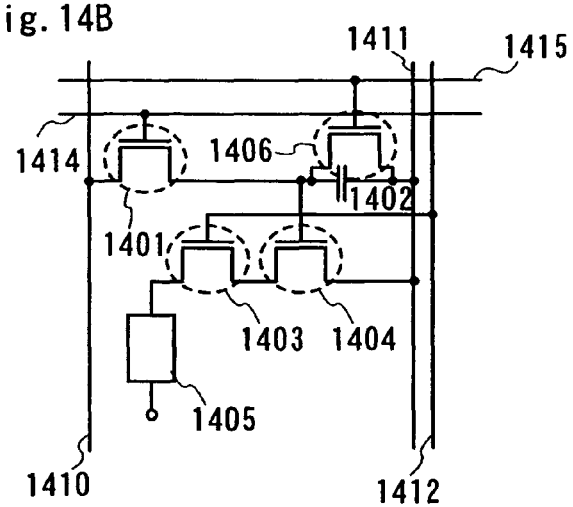
Figure 14C:
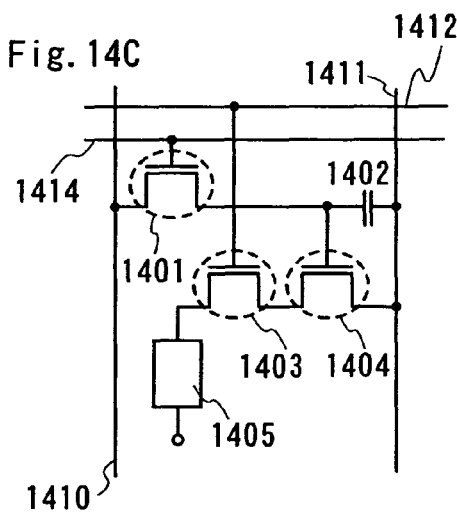

A pixel shown in FIG. 14C is the same as that in FIG. 14A except for that a gate electrode of the driving TFT 1403 is connected to the power source line 1412 provided in a row direction. That is, the pixels shown in FIGS. 14A and 14C are equivalent circuits. However, each power source line is formed of a conductive film of a different layer between the case (FIG. 14A) where the power source line 1412 is provided in a row direction and the case (FIG. 14C) where the power source line 1412 is provided in a column direction. Here, a wire to which a gate electrode of the driving TFT 1403 is connected is described with reference to FIGS. 14A and 14C separately in order to show that the wire is formed of different layers.

In the pixels shown in FIGS. 14A and 14C, the driving TFT 1403 and the current controlling TFT 1404 are connected in series. The channel length L (1403) and the channel width W (1403) of the driving TFT 1403 and the channel length L (1404) and the channel width W (1404) of the current controlling TFT 1404 are preferably set so as to satisfy L (1403)/W (1403):L (1404)/W (1404)=5 to 6000:1.

It is to be noted that the driving TFT 1403 operates in a saturation region and has a function to control a current value supplied to the light emitting element 1405. The current controlling TFT 1404 operates in a linear region and has a function to control a current supply to the light emitting element 1405. In view of manufacturing steps, it is preferable that both TFTs have the same conductivity type. In this embodiment mode, both TFT are formed as n-channel TFTs. The driving TFT 1403 may be an depletion type TFT as well as an enhancement type TFT. In a light emitting device of the invention with the aforementioned structure, the current controlling TFT 1404 operates in a linear region, therefore, a slight change in Vgs of the current controlling TFT 1404 does not affect a current value supplied to the light emitting element 1405. That is, the current value supplied to the light emitting element 1405 can be determined by the driving TFT 1403 which operates in a saturation region. With the aforementioned structure, such a light emitting device can be provided in which image quality is improved by improving luminance variations of a light emitting device caused by the variations in characteristics of a TFT.

In the pixels shown in FIGS. 14A to 14D, the switching TFT 1401 controls a video signal input to the pixel. When the switching TFT 1401 is turned on, a video signal is inputted to the pixel. Then, the voltage of the video signal is held in the capacitor 1402. It is to be noted that the capacitor 1402 is provided in FIGS. 14A and 14C; however, the invention is not limited to this. When gate capacitance or the like is large enough to hold the video signal, the capacitor 1402 is not required to be provided.

Figure 14D:
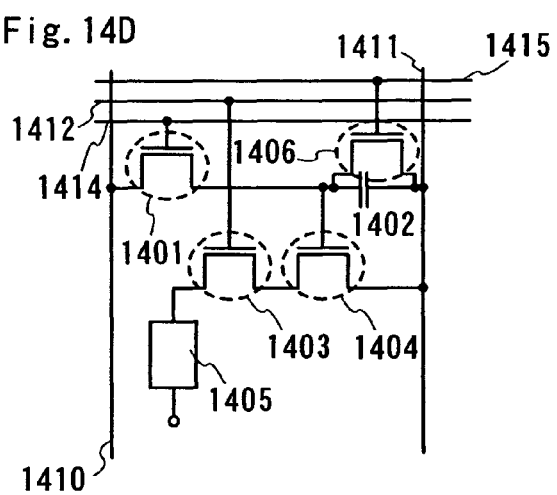

The pixel shown in FIG. 14B is the same as the pixel configuration shown in FIG. 14A except for that a TFT 1406 and the scan line 1414 are additionally provided. Similarly, the pixel shown in FIG. 14D is the same as the pixel configuration shown in FIG. 14C except for that the TFT 1406 and the scan line 1414 are additionally provided.

The TFT 1406 is controlled to be on or off by the scan line 1414 which is additionally provided. When the TFT 1406 is turned on, the charge held in the capacitor 1402 is discharged, thereby the current controlling TFT 1404 is turned off. That is, by providing the TFT 1406, a current supply to the light emitting element 1405 can be forcibly blocked. Therefore, the TFT 1406 can be called an erasing TFT. As a result, with the configurations shown in FIGS. 14B and 14D, the duty ratio can be improved since a light emission period can start at the same time or right after a writing period without waiting for signals for all the pixels to be written.

Figure 14E:
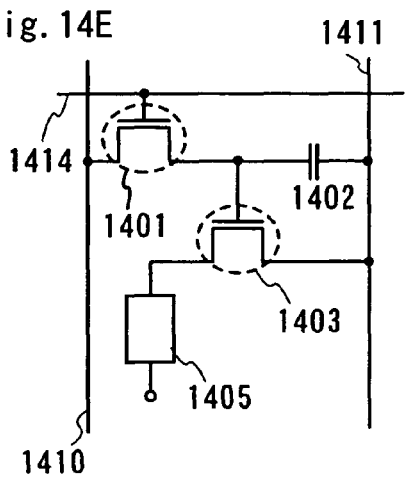
Figure 14F:
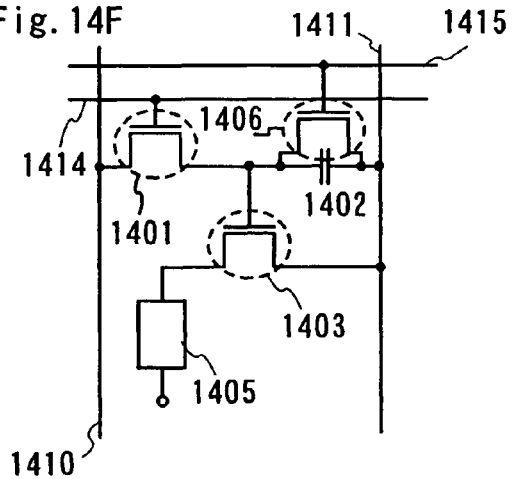

In a pixel shown in FIG. 14E, the signal line 1410 and the power source line 1411 are provided in a column direction and the scan line 1414 is provided in a row direction. Further, the switching TFT 1401, the driving TFT 1403, the capacitor 1402, and the light emitting element 1405 are provided. A pixel shown in FIG. 14F is the same as the pixel configuration shown in FIG. 14E except for that the TFT 1406 and the scan line 1415 are additionally provided. It is to be noted that the duty ratio can be improved in the configuration shown in FIG. 14F as well by providing the TFT 1406.

Figure 16:
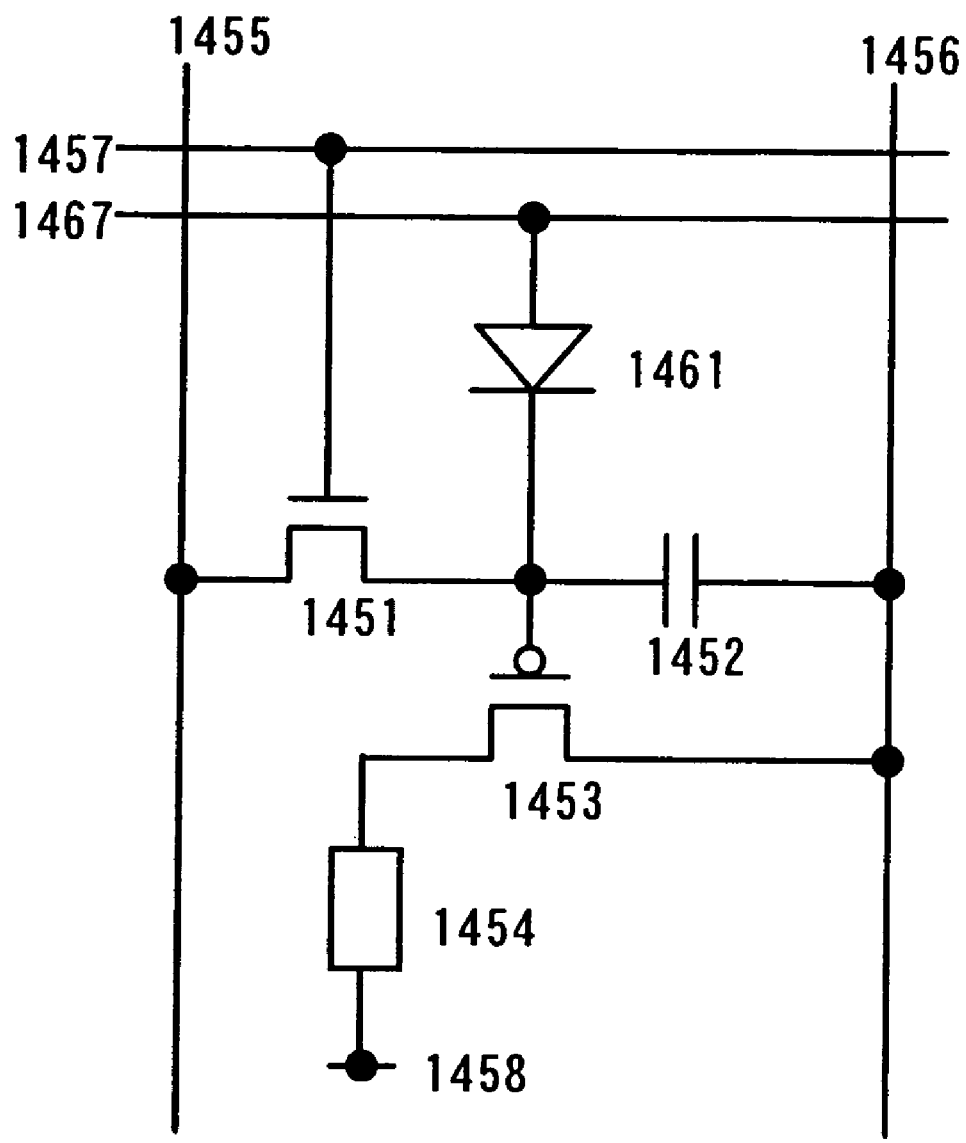
FIG. 16 is a circuit diagram showing an example of a pixel circuit.

FIG. 16 is a pixel configuration example of the case where the driving TFT 1403 is forcibly turned off. A selecting TFT 1451, a driving TFT 1453, an erasing diode 1461, and a light emitting element 1454 are provided. A source and a drain of the selecting TFT 1451 are each connected to a signal line 1455 and a gate of the driving TFT 1453. A gate of the selecting TFT 1451 is connected to a first gate line 1457. A source and a drain of the driving TFT 1453 are each connected to a first power source line 1456 and the light emitting element 1454. An erasing diode 1461 is connected to the gate of the driving TFT 1453 and a second gate line 1467.

The capacitor 1452 has a function to hold a gate potential of the driving TFT 1453. Therefore, the capacitor 1452 is connected between the gate of the driving TFT 1453 and the power source line 1456, however, the invention is not limited to this. The capacitor 1452 is only required to be provided so as to be able to hold the gate potential of the driving TFT 1453. Moreover, in the case where the gate capacitance of the driving TFT 1453 is large enough to hold the gate potential of the driving TFT 1453, the capacitor 1452 is not require to be provided.

As an operating method, the first gate line 1457 is selected, the selecting TFT 1451 is turned on, and a signal is inputted from the signal line 1455 to the capacitor 1452. Then, a current flowing through the driving TFT 1453 is controlled in accordance with the held signal. A current flows from the first power source line 1456 through the light emitting element 1454 to a second power source line 1458.

When a signal is required to be erased, the second gate line 1467 is selected (high potential here) to turn on the erasing diode 1461, thereby a current flows from the second gate line 1467 to the gate of the driving TFT 1453. As a result, the driving TFT 1453 is turned off. Then, a current does not flow through the light emitting element 1454 to the second power source line 1458. Consequently, a length of a light emission period can be freely controlled.

When a signal is required to be held, the second gate line 1467 is non-selected (low potential here). Then, the erasing diode 1461 is turned off; therefore, the gate potential of the driving TFT 1453 is held.

It is to be noted that the erasing diode 1461 may be any elements having a rectifying property. It may be a PN diode, PIN diode, a Schottky diode, or a Zener diode.

As described above, various pixel circuits can be employed. In particular, in the case of forming a thin film transistor using an amorphous semiconductor film, it is preferable that the semiconductor films of the driving TFTs 1403 and 1453 be formed large. Therefore, it is preferable that the aforementioned pixel configuration has a top light emission type in which light is emitted from a light emission stacked-layer to the counter substrate side.

Such an active matrix light emitting device is considered advantageous in that it can be driven with a low voltage when the pixel density is increased, since a TFT is provided for each pixel.

In this embodiment mode, description is made on an active matrix light emitting device in which a TFT is provided in each pixel, however, the invention can also be applied to a passive matrix light emitting device. A passive matrix light emitting device has a high aperture ratio since a TFT is not provided in each pixel. In the case of a light emitting device in which light is emitted to both sides of a light emission stacked-layer, the light transmittance can be enhanced when a passive matrix light emitting device is used.

Subsequently, description is made on the case where a diode is provided as a protection circuit for the scan line and the signal line in an equivalent circuit shown in FIG. 14E.

Figure 15:
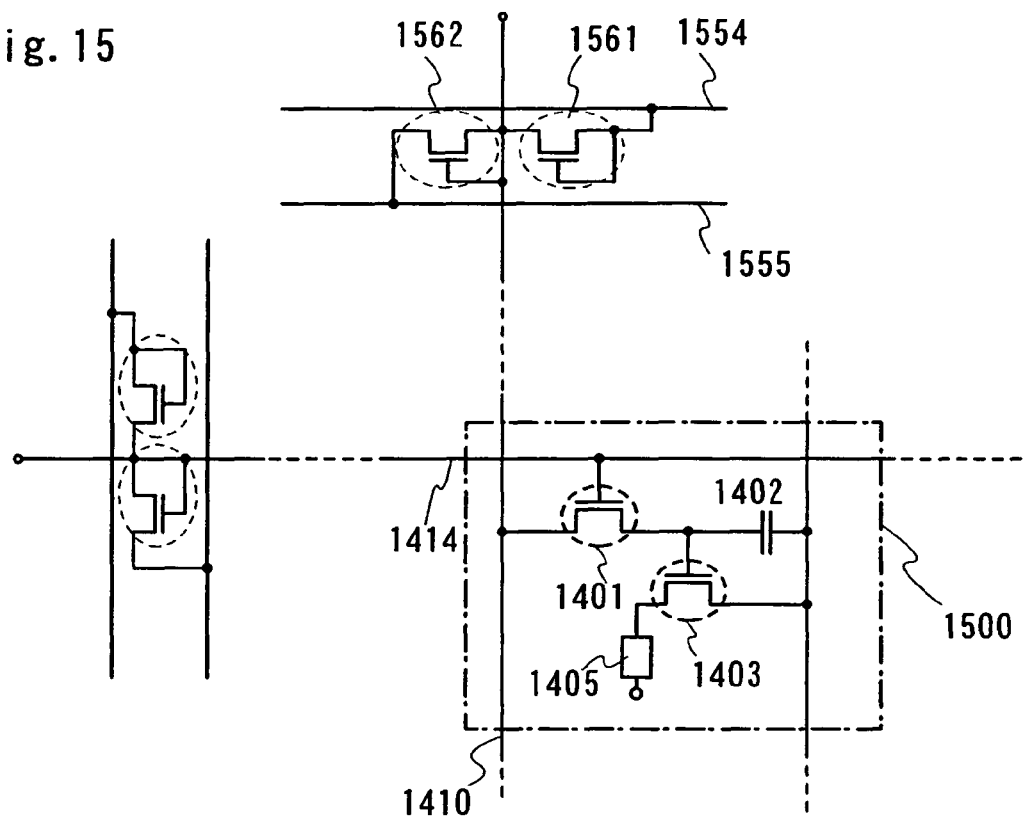
FIG. 15 is a circuit diagram showing an example of a protective circuit.

In FIG. 15, the switching TFTs 1401 and 1403, the capacitor 1402, and the light emitting element 1405 are provided in a pixel portion 1500. The signal line 1410 is provided with diodes 1561 and 1562. The diodes 1561 and 1562 are formed in accordance with the aforementioned embodiment mode similarly to the switching TFTs 1401 and 1403, so as to have a gate electrode, a semiconductor layer, a source electrode, and a drain electrode. Each of the diodes 1561 and 1562 has the gate electrode connected to the drain electrode or the source electrode so as to operate as a diode.

Common potential lines 1554 and 1555 connected to the diodes are formed of the same layer as the gate electrodes of the diodes. Therefore, a contact hole is required to be formed in a gate insulating layer so that the common potential lines 1554 and 1555 are connected to the source electrode or the drain electrode of the diode.

The diode provided for the scan line 1414 has a similar configuration.

In this manner, with the invention, a protection diode provided for an input stage can be simultaneously formed. It is to be noted that the position of the protection diode is not limited to this and the protection diode may be provided between the driver circuit and the pixel.

A light emitting device of the invention having such a protection circuit is a light emitting device with high light efficiency and color purity, and a low driving voltage. With the aforementioned structure, reliability of the light emitting device can be enhanced.

Embodiment Mode 19

Figure 17A:
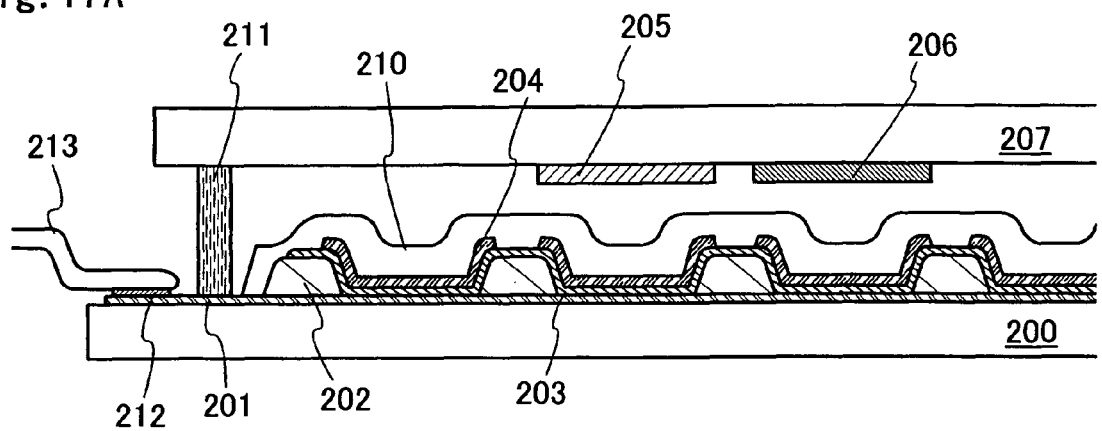
FIGS. 17A and 17B are a top schematic view and a cross sectional schematic view of a light emitting device of the invention respectively.

In this embodiment mode, a panel of a passive matrix light emitting device as a light emitting device of the invention is described with reference to FIGS. 17A and 17B. FIG. 17A is a cross sectional view of a light emitting device of the invention with the same configuration as that in Embodiment Mode 5. FIG. 17A is a cross sectional view taken along a direction perpendicular to the direction of taking the cross sectional view of FIG. 5A. Portions denoted by the same reference numerals as those in FIG. 5A denote the same configurations.

A protection film 210 is formed in a light emitting device to prevent moisture or the like from entering. A counter substrate 207 formed of glass, quartz, or a ceramic material such as alumina, or a synthetic material thereof is fixed by a sealing adhesive 211. An external input terminal portion is connected to an external circuit through an anisotropic conductive film 212 by using a flexible printed wiring substrate 213. The protection film 210 may be formed of silicon nitride, or may be formed of a stack of carbon nitride and silicon nitride to enhance a gas barrier property while decreasing stress.

Figure 17B:
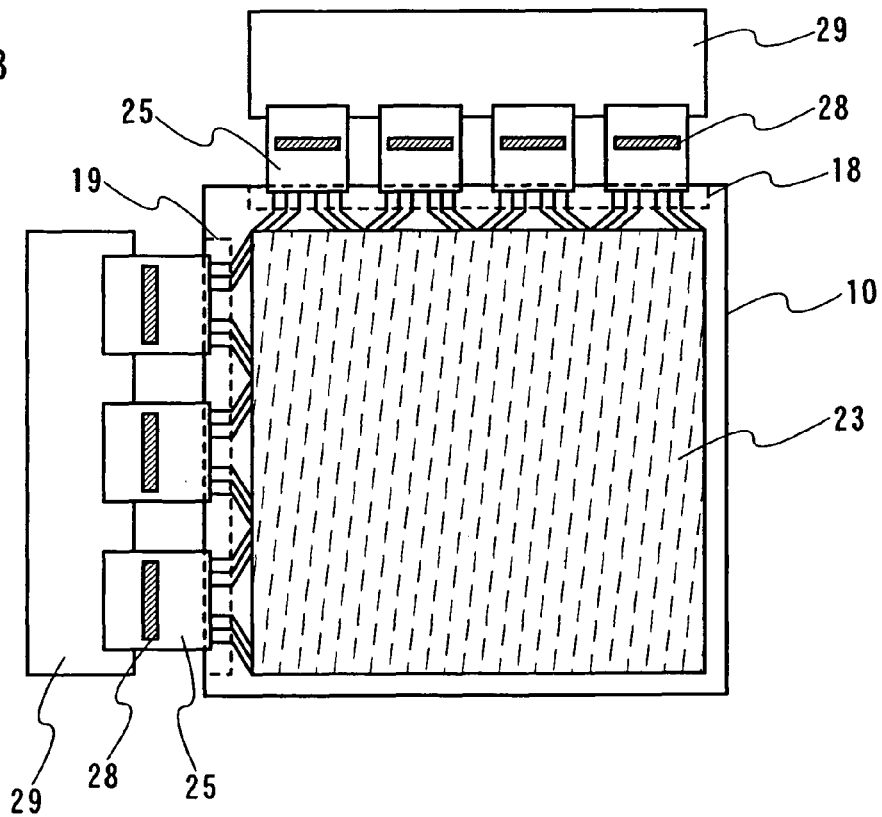

FIG. 17B shows a module where an external circuit is connected to the panel shown in FIG. 17A. The module is electrically connected to external circuit substrates where a power source circuit and a signal processing circuit are formed by fixing a flexible printed wiring substrate 25 to external input terminal portions 18 and 19. Moreover, a driver IC 28 as one of the external circuits may be mounted by either a COG method or a TAB method. FIG. 17B shows the driver IC 28 as one of the external circuits mounted by a COG method.

It is to be noted that the panel and the module correspond to one mode of a light emitting device of the invention and are both included in the scope of the invention.

Embodiment Mode 20

Electronic devices of the invention mounting a light emitting device (module) of the invention are, a camera such as a video camera and a digital camera, a goggle type display (head mounted display), a navigation system, an audio reproducing device (a car audio component set or the like), a computer, a game machine, a mobile information terminal (mobile computer, mobile phone, mobile game machine, electronic book, or the like), an image reproducing device provided with a recording medium (specifically, a device which reproduces a recording medium such as a DVD (Digital Versatile Disc) and includes a display capable of displaying the reproduced image, and the like. Specific examples of these electronic devices are shown in FIGS. 18A to 18E.

FIG. 18A illustrates a light emitting device such as a television receiver and a monitor of a personal computer. A housing 2001, a display portion 2003, speaker portions 2004, and the like are included. The display portion 2003 of a light emitting device of the invention has high light emission efficiency and favorable color purity. A polarizing plate or a circular polarizing plate is preferably provided in a pixel portion to enhance the contrast. For example, a ¼λ plate, a ½λ plate, and a polarizing plate are provided over a counter substrate in this order. Moreover, a reflection preventing film may be provided over the polarizing plate as well.

FIG. 18B illustrates a mobile phone including a main body 2101, a housing 2102, a display portion 2103, an audio input portion 2104, an audio output portion 2105, an operating key 2106, an antenna 2108, and the like. The display portion 2103 of the mobile phone of the invention has high light emission efficiency and favorable color purity.

FIG. 18C illustrates a computer including a main body 2201, a housing 2202, a display portion 2203, a keyboard 2204, an external connecting port 2205, a pointing mouse 2206, and the like. The display portion 2203 of the computer of the invention has high light emission efficiency and favorable color purity. FIG. 18C illustrates a notebook type computer, however, the invention can also be applied to a desktop type computer or the like.

FIG. 18D illustrates a mobile computer including a main body 2301, a display portion 2302, a switch 2303, operating keys 2304, an infrared port 2305, and the like. The display portion 2302 of the mobile computer of the invention has high light emission efficiency and favorable color purity.

FIG. 18E illustrates a mobile game machine including a housing 2401, a display potion 2402, speaker portions 2403, operating keys 2404, a memory medium insert portion 2405, and the like. The display portion 2402 of the mobile game machine of the invention has high light emission efficiency and favorable color purity.

As described above, the application range of the invention is quite wide and the invention can be used for electronic devices of any field.

This embodiment mode can be appropriately implemented in combination with other appropriate embodiment modes. This application is based on Japanese Patent Application serial no. 2005-169061 filed in Japan Patent Office on 9th, Jun., 2005, the entire contents of which are hereby incorporated by reference.

What is claimed is:

1. A light emitting device comprising:
   a color conversion layer and a blue color filter, each formed over and in direct contact with a same surface;
   a smoothing layer formed over the color conversion layer and the blue color filter;
   a base insulating film formed over the smoothing layer;
   a thin film transistor formed over the base insulating film, wherein the thin film transistor includes a semiconductor layer and a gate electrode with a gate insulating film interposed therebetween;
   an interlayer insulating film formed over the gate electrode; and
   a first light emitting element and a second light emitting element, each comprising a pair of electrodes, a light emitting layer, and a layer sandwiched between the pair of electrodes,
   wherein first light is emitted from the first light emitting element through the blue color filter,
   wherein the color conversion layer absorbs second light emitted from the second light emitting element and generates third light with a longer wavelength than a wavelength of the second light,
   wherein the layer includes a buffer layer containing a composite material comprising an organic compound which has a hole transporting property and a metal oxide, and
   wherein the semiconductor layer does not overlap the blue color filter and the color conversion layer.

2. The light emitting device according to claim 1, wherein the one of the pair of electrodes comprises a material having a reflectivity of 70% or more against light emitted from the light emitting layer, and the other one of the pair of electrodes comprises a transparent conductive material.

3. The light emitting device according to claim 1, wherein the metal oxide is oxide of transition metal.

4. The light emitting device according to claim 1, wherein the metal oxide is oxide of metal which belongs to groups 4 to 8 of a periodic table of elements.

5. The light emitting device according to claim 1, wherein the metal oxide is selected from the group consisting of vanadium oxide, tantalum oxide, molybdenum oxide, tungsten oxide, rhenium oxide, and ruthenium oxide.

6. The light emitting device according to claim 1, wherein the buffer layer comprises a second layer which has a function to generate an electron provided on a side of one of the electrodes which functions as an anode.

7. The light emitting device according to claim 1, wherein the first and the second light is in a blue region and the third light is in a red region.

8. The light emitting device according to claim 1, wherein the first and the second light is in a blue region and the third light is in a green region.

9. The light emitting device according to claim 1, wherein the color conversion layer is provided between a substrate and the second light emitting element.

10. An electronic device mounting the light emitting device according to claim 1, wherein the electronic device is selected from the group consisting of a camera, a goggle type display, a navigation system, an audio reproducing device, a computer, a game machine, a mobile information terminal, and an image reproducing device.

11. A light emitting device comprising:
a color conversion layer and a blue color filter, each formed over and in direct contact with a same surface;
a smoothing layer formed over the color conversion layer and the blue color filter;
a base insulating film formed over the smoothing layer;
a thin film transistor formed over the base insulating film, wherein the thin film transistor includes a semiconductor layer and a gate electrode with a gate insulating film interposed therebetween;
an interlayer insulating film formed over the gate electrode; and
a first light emitting element and a second light emitting element, each comprising a pair of electrodes, a light emitting layer, and a layer sandwiched between the pair of electrodes,
wherein first light is emitted from the first light emitting element through the blue color filter,
wherein the color conversion layer absorbs second light emitted from the second light emitting element and generates third light with a longer wavelength than a wavelength of the second light,
wherein the layer includes a buffer layer comprising a composite material comprising an organic compound which has a hole transporting property and a metal compound,
wherein an optical distance L between a light emitting region of the light emitting layer and the one of the pair of electrodes is controlled by a thickness of the buffer layer, and
wherein the semiconductor layer does not overlap the blue color filter and the color conversion layer.

12. The light emitting device according to claim 11, wherein the optical distance L between the light emitting region and the one of the electrodes satisfies $L=(2m-1)\lambda/4$ when a maximum wavelength of light emitted from the light emitting layer is $\lambda$.

13. The light emitting device according to claim 11, wherein the one of the pair of electrodes comprises a material having a reflectivity of 70% or more against light emitted from the light emitting layer, and the other one of the pair of electrodes comprises a transparent conductive material.

14. The light emitting device according to claim 11, wherein the metal compound is oxide of transition metal.

15. The light emitting device according to claim 11, wherein the metal compound is oxide of metal which belongs to groups 4 to 8 of a periodic table of elements.

16. The light emitting device according to claim 11, wherein the metal compound is selected from the group consisting of vanadium oxide, tantalum oxide, molybdenum oxide, tungsten oxide, rhenium oxide, and ruthenium oxide.

17. The light emitting device according to claim 11, wherein the buffer layer comprises a second layer which has a function to generate an electron provided on a side of one of the electrodes which functions as an anode of the buffer layer.

18. The light emitting device according to claim 11, wherein the first and the second light is in a blue region and the third light is in a red region.

19. The light emitting device according to claim 11, wherein the first and the second light is in a blue region and the third light is in a green region.

20. The light emitting device according to claim 11, wherein the color conversion layer is provided between a substrate and the second light emitting element.

21. An electronic device mounting the light emitting device according to claim 11, wherein the electronic device is selected from the group consisting of a camera, a goggle type display, a navigation system, an audio reproducing device, a computer, a game machine, a mobile information terminal, and an image reproducing device.

22. The light emitting device according to claim 1, wherein the smoothing layer contains one of acrylic, polyimide, and siloxane.

23. The light emitting device according to claim 11, wherein the smoothing layer contains one of acrylic, polyimide, and siloxane.

24. The light emitting device according to claim 1, wherein the buffer layer is in contact with one of the pair of electrodes.

25. The light emitting device according to claim 11, wherein the buffer layer is in contact with one of the pair of electrodes.

26. The light emitting device according to claim 1, wherein the same surface is a substrate surface.

27. The light emitting device according to claim 11, wherein the same surface is a substrate surface.

* * * * *